(12) United States Patent
Stoopman et al.

(10) Patent No.: US 11,581,877 B1
(45) Date of Patent: Feb. 14, 2023

(54) NEGATIVE-FEEDBACK FOUR-PHASE GENERATOR WITH TWENTY-FIVE PERCENT DUTY CYCLE OUTPUT

(71) Applicant: NXP B. V., Eindhoven (NL)

(72) Inventors: Mark Stoopman, Capelle aan den ijssel (NL); Erik Olieman, Waalre (NL); Peter van der Cammen, Delft (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 17/516,927

(22) Filed: Nov. 2, 2021

(51) Int. Cl.
| | |
|---|---|
| *H03K 3/037* | (2006.01) |
| *H03K 5/04* | (2006.01) |
| *H03K 5/01* | (2006.01) |
| *H03H 7/06* | (2006.01) |
| *H04B 1/40* | (2015.01) |
| *H03F 3/45* | (2006.01) |
| *H03K 5/00* | (2006.01) |

(52) U.S. Cl.
CPC ......... *H03K 3/037* (2013.01); *H03F 3/45475* (2013.01); *H03H 7/06* (2013.01); *H03K 5/01* (2013.01); *H03K 5/04* (2013.01); *H04B 1/40* (2013.01); *H03K 2005/00019* (2013.01)

(58) Field of Classification Search
CPC ............. H03K 3/037; H03K 5/01; H03K 5/04
USPC ................................ 327/254, 255, 258, 259
See application file for complete search history.

(56) References Cited

U.S. PATENT DOCUMENTS

| | | | |
|---|---|---|---|
| 5,963,071 A | 10/1999 | Dowlatabadi | |
| 7,010,287 B2 | 3/2006 | Oh et al. | |
| 7,729,459 B1* | 6/2010 | Kang | .......... H04L 7/0338 |
| | | | 713/400 |
| 8,248,130 B2 | 8/2012 | Jain et al. | |
| 2002/0140477 A1 | 10/2002 | Zhou et al. | |

OTHER PUBLICATIONS

Wang et al., "A 5-GHz Band I/Q Clock Generator Using a Self-Calibration Technique," IEEE, Proceedings of the 28th European Solid-State Circuits Conference (2002) pp. 807-810 (downloaded on Jun. 3, 2021 from IEEE Xplore).

(Continued)

*Primary Examiner* — William Hernandez

(57) ABSTRACT

A four-phase (or multi-phase) generation circuit, related method of operation, and transceivers or other systems utilizing such a circuit, are disclosed herein. In one example embodiment, the circuit includes two input ports respectively configured to receive positive and negative differential input signals, and four output ports respectively configured to output first, second, third and fourth output signals, respectively, the second, third, and fourth output signals being respectively phase-shifted relative to the first output signal by or substantially by 90, 180, and 270 degrees. Also, the circuit includes four SR latches respectively including output terminals that are respectively coupled to the respective output ports. Further, the circuit includes two tunable delay circuits respectively coupled at least indirectly between the input ports and latches, and two comparison circuits configured to output respective feedback signals. The latches receive two delayed input signals provided by the delay circuits based upon the feedback signals.

20 Claims, 7 Drawing Sheets

(56) References Cited

OTHER PUBLICATIONS

He et al., "A Low-Power, Low-EVM, SAW-Less WCDMA Transmitter Using Direct Quadrature Voltage Modulation," journal, IEEE Journal of Solid-State Circuits, vol. 44, No. 12, pp. 3448-3458 (Dec. 2009) (downloaded on May 27, 2021 from IEEE Xplore).

Ghaffari et al., "Tunable High-Q N-Path Band-Pass Filters: Modeling and Verification," IEEE, Journal of Solid-State Circuits, vol. 46, No. 5, pp. 998-1010 (May 2011) doi: 10.1109/JSSC.2011.2117010.

Keith, "What is the difference between op amps and comparators?," article, 9 pages (believed to be publicly available since 2015) https://www.electroschematics.com/what-difference-between-op-amps-comparators/.

* cited by examiner

NEGATIVE-FEEDBACK FOUR-PHASE GENERATOR WITH TWENTY-FIVE PERCENT DUTY CYCLE OUTPUT

FIELD OF THE DISCLOSURE

The present disclosure relates to systems and methods for generating multiple output signals with different phases that are based upon one or more input (or source) signals, such as differential clock signals, and more particularly relates to systems and methods employing or operating as four-phase generator circuits (e.g., quadrature signal generators), as can be utilized in any of a variety of applications such as computer applications and communications applications involving radio frequency (RF) transmitters, receivers, and transceivers.

BACKGROUND OF THE DISCLOSURE

Four-phase generators (e.g., quadrature generators) are employed in a variety of applications and circumstances, such as in the context of computer applications and communications applications involving radio frequency (RF) transmitters, receivers, or transceivers. Such four-phase generators are utilized to generate multiple output signals having different phases that are based upon one or more input signals that are lesser in number than the output signals, but that share the same frequency. The multiple output signals typically are identical or substantially similar to one another (e.g., in terms of magnitude, and/or amplitude, period, and/or waveform) except in terms of their phases.

Conventional four-phase generators can involve any of several concepts or techniques. For example, according to a first concept, frequency division is achieved by using an input clock signal that has a higher input clock frequency than the frequency of the output signals that are generated. Also for example, according to a second concept, a filter is employed to generate 90° phase shifts from an input signal to one or more output signals. Further for example, according to a third concept, a high-speed logic combination of already-existing differential quadrature signals can be employed to generate four-phase outputs from the already-existing differential quadrature signals.

Although such conventional concepts or techniques can be employed to generate four phases from one or more input or source signals (such as can be provided by a differential input clock), such conventional concepts or techniques each have one or more disadvantage(s). To begin, depending upon the implementation of these concepts, additional circuits may be needed to convert the 50% duty cycle outputs to 25%. Additionally, particularly with respect to the first concept involving the higher input clock frequency, this concept requires that a higher input frequency clock be generated or otherwise be available in the system, which in turn increases the system level complexity and power consumption.

Also, with respect to the second concept involving the use of a filter, this concept relies upon such a filter being tuned to the desired frequency in order to generate the desired 90° phase shifts. This narrow-band solution is sensitive to process variations and is not easily scalable to other frequencies. Further, with respect to the third concept involving high-speed logic, this concept can only be implemented in certain circumstances, insofar as the concept requires that existing differential signals be already available for use. Further, the high-speed logic employed by the third concept also can introduce additional phase error.

For at least one or more of these reasons, or one or more other reasons, it would be advantageous if new or improved systems, concepts, or circuits could be developed, and/or improved methods, processes, or techniques for operation or implementation could be developed, so as to address any one or more of the concerns discussed above or to address one or more other concerns or provide one or more benefits.

DETAILED DESCRIPTION

The present disclosure relates to systems and methods for generating multiple output signals with different phases that are based upon one or more input (or source) signals, which can for example be differential input signals such as differential clock signals. In at least some embodiments, the present disclosure particularly relates to four-phase generators (or quadrature signal generators) that generate four output signals that are identical or substantially identical (e.g., in terms of magnitude, and/or amplitude, period, and/or waveform) to one another except insofar as the respective output signals are phase shifted relative to one another.

In at least some such embodiments, the four-phase generators operate based on a negative-feedback configuration that creates a 90° phase shift between each successive pair of the output signals (the output phases). More particularly, in at least some such embodiments, 90° phase shifts are created between the different successive output signals (or output phases) using two delay cells that are controlled by two operational amplifiers (opamps) in a negative-feedback configuration. Further, in at least some such embodiments, each of the output signals has a 25% duty cycle. The 25% duty cycle outputs are created by SR (set-reset) latches that are located inside the feedback loop.

Also, in at least some such embodiments, the output frequency of each of the four output signals having the four different phases equals the input frequency. The four-phase generators do not require a higher input frequency or any existing quadrature inputs to operate, but instead operate to generate the four output signals having four different phases from differential input signals (e.g., a differential input clock signal) having the same frequency as the output signals. The negative feedback loop continuously measures and minimizes the output phase error, which might otherwise occur due to (for example) process, supply, and temperature variations. This allows for highly accurate phase relations. Further, at least some such embodiments can be scaled to other frequencies due to their wideband properties.

Figure 1:
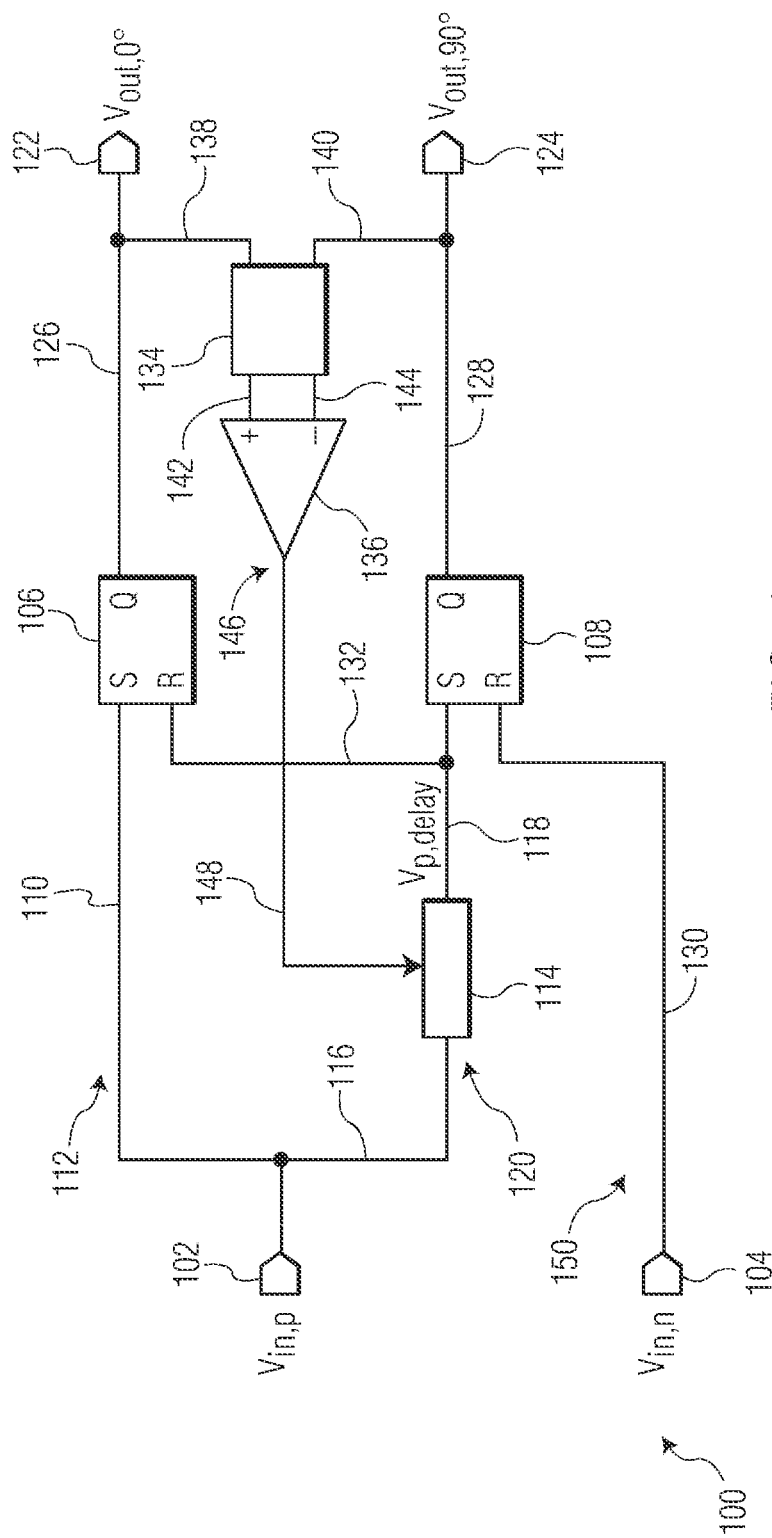
FIG. 1 is a schematic diagram showing a first circuit that is configured to generate, based upon differential input signals, a pair of output signals that are respectively out of phase with one another by 90 degrees, and that can serve as one of a pair of cores (circuits or subcircuits) that in combination can together form a four-phase generator, in accordance with a first example embodiment encompassed herein.

In at least some embodiments, a four-phase generator circuit is formed as a combination of two identical cores or circuits (or subcircuits) that together create the four output signals having the four different phases. Each of the cores generates two 90° out-of-phase signals. Further, in this regard, FIG. 1 provides a schematic diagram showing a first circuit 100 that can serve as one of a pair of cores (circuits or subcircuits) that in combination can together form a four-phase generator. The first circuit 100 particularly is configured to generate, based upon differential input signals, a pair of output signals that are respectively out of phase with one another by 90 degrees.

As shown, the first circuit 100 includes first and second input ports 102 and 104, respectively, at which are received positive and negative differential input signals $V_{in,p}$ and $V_{in,n}$, which together can be referred to also as a differential input signal and can be, for example, a differential input clock (or clock signal). It will be appreciated that the respective positive and negative differential input signals $V_{in,p}$ and $V_{in,n}$ that are received at the first and second ports 102 and 104, respectively, can be identical or substantially identical to one another except that the two signals are 180 degrees out of phase with (are in anti-phase relative to) one another. In the present embodiment, it is envisioned that each of the positive and negative differential input signals $V_{in,p}$ and $V_{in,n}$ will and should have duty cycles of 50% to allow for desired operation of the first circuit 100. It will be appreciated that the use of differential input signals is advantageous in that it affords common mode rejection and lessens noise sensitivity.

Further as illustrated in FIG. 1, the first circuit 100 includes each of a first SR latch 106 and a second SR latch 108, which are identical and are both reset-dominant SR latches. Each of first and second SR latches 106 and 108 particularly operates in a manner consistent with the truth table shown in Table 1. As shown, the first port 102 is directly coupled by way of a first linkage 110 to a S (set) terminal of the first latch 106, and this linkage can be considered to form a first main signal path 112 originating from the first port. Additionally, the first port 102 is directly coupled to a tunable delay cell 114 by way of a second linkage 116, which in turn is directly coupled to a S terminal of the second latch 108 by way of a third linkage 118. The second and third linkages 116 and 118 extending from the first input port 102 to the S terminal of the second latch 108, indirectly by way of the tunable delay cell 114, can be considered to form a delayed signal path 120 originating from the first input port.

TABLE 1

TRUTH TABLE OF A RESET-DOMINANT SR LATCH

| S | R | Q |
|---|---|---|
| 0 | 0 | HOLD |
| 0 | 1 | 0 |
| 1 | 0 | 1 |
| 1 | 1 | 0 |

Additionally, the first circuit 100 also includes each of a first output port 122 and a second output port 124. During operation, the first circuit 100 particularly outputs first and second output signals $V_{out,\,0°}$ and $V_{out,\,90°}$, respectively, at the first output port 122 and the second output port 124. As shown, the first output port 122 is directly coupled to a Q terminal of the first latch 106 by way of a fourth linkage 126, and the second output port 124 is directly coupled to a Q terminal of the second latch 108 by way of a fifth linkage 128. It should further be appreciated that the second input port 104 is directly coupled to a R (reset) terminal of the second latch 108 by way of a sixth linkage 130, and that a R terminal of the first latch 106 is directly coupled to the S terminal of the second latch 108 (and thus also directly coupled to the tunable delay cell 114) by way of a seventh linkage 132. The sixth linkage 130 can be considered to form a second main signal path 150.

Further, as shown, the first circuit 100 includes a negative feedback loop that is provided by way of a low-pass filter (LPF) 134 and an operational amplifier (or opamp) 136. The LPF 134 particularly is directly coupled to each of the first and second output ports 122 and 124, respectively, by way of eight and ninth linkages 138 and 140, respectively. Further, the LPF 134 also is directly coupled to each of a non-inverting terminal 142 and an inverting terminal 144 of the operational amplifier 136, such that the first and second input ports 122 and 124 are indirectly coupled to the non-inverting and inverting terminals by way of the LPF. Additionally, an output terminal 146 of the operational amplifier 136 is coupled directly to the tunable delay cell 114 by way of a tenth linkage 148, by which the operational amplifier communicates a negative feedback signal from that output terminal to that tunable delay cell. It should be appreciated that the negative feedback particularly influences an intermediate signal $V_{p,\,delay}$ that is communicated, by way of the third linkage 118, from the tunable delay cell 114 to the S terminal of the second latch 108 (and thus also to the R terminal of the first latch 106). It is envisioned that the feedback provided from the output terminal 146 of the operational amplifier 136 to the tunable delay cell 114 will be analog feedback, particularly in this embodiment in the form of analog voltage feedback.

The operational amplifier 136 is merely one example of a comparison circuit that can provide such analog feedback, and the present disclosure is also intended to encompass other comparison circuits that can provide such feedback.

For example, in one alternate embodiment, the combination of a comparator and a low-pass filter can be employed in place of the operational amplifier 136, where the low-pass filter is coupled between the output terminal of the comparator and the tunable delay cell. Also for example, in another alternate embodiment, the tunable delay cell can be current-controlled rather than voltage-controlled, and the analog feedback provided to the tunable delay cell can be analog current feedback rather than analog voltage feedback. Such current feedback can be provided, for example, if a comparison circuit employing a transconductance amplifier is implemented (instead of the operational amplifier 136). Such alternate embodiments of comparison circuits (and/or tunable delay cells) in addition to the operational amplifier 136 (and tunable delay cell 114) can also be implemented in other embodiments encompassed herein, such as those described in relation to FIGS. 3, 5, and 6 below.

Figure 2:
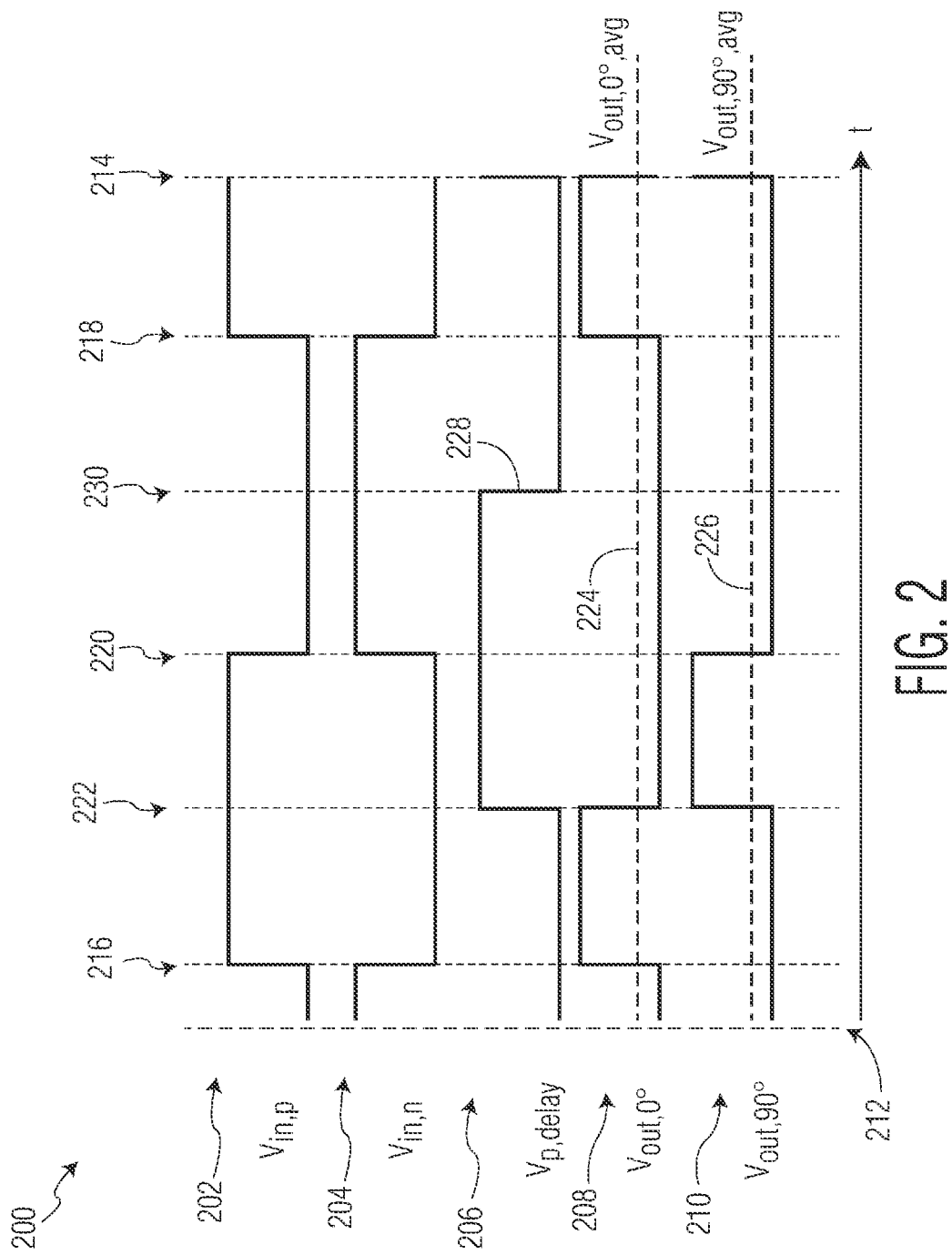
FIG. 2 is a timing diagram illustrating example variations, over a portion of time, of the differential input signals, output signals, and an intermediate delayed signal communicated within the first circuit of FIG. 1.

Referring additionally to FIG. 2, operation of the first circuit 100 in terms of generating the first and second output signals $V_{out,\,0°}$ and $V_{out,\,90°}$ based upon the positive and negative differential input signals $V_{in,p}$ and $V_{in,n}$ is illustrated by way of a timing diagram 200. The timing diagram 200 particularly includes shows each of a first graph 202, a second graph 204, a third graph 206, a fourth graph 208, and a fifth graph 210. The first graph 202 shows an example excerpt of the positive differential input signal $V_{in,p}$ (received at the first input port 102 of the first circuit 100) over a first time period, from a first time 212 to a second time 214, and the second graph 204 shows an example excerpt of the negative differential input signal $V_{in,n}$ (received at the second input port 104 of the first circuit 100) contemporaneously occurring over that same first time period. Additionally, the third graph 206 shows an example excerpt of the intermediate signal $V_{p,\,delay}$ that is communicated along the third linkage 118 of the first circuit 100 contemporaneously with the aforementioned excerpts of the positive and negative differential input signals during the first time period from the first time 212 to the second time 214. Further, the fourth graph 208 shows an example excerpt of the first output signal $V_{out,\,0°}$ (provided at the first output port 122 of the first circuit 100) and the fifth graph 210 shows an example excerpt of the second output signal $V_{out,\,90°}$ (provided at the second output port 124 of the first circuit 100), both contemporaneously occurring over that same first time period between the first time 212 and second time 214.

The timing diagram 200 of FIG. 2 particularly highlights certain aspects of how the first circuit 100 generates the first and second output signals $V_{out,\,0°}$ and $V_{out,\,90°}$ that are respectively provided at the first and second output ports 122 and 124, respectively. In particular, it can be seen from the first graph 202 that, when the positive differential input signal $V_{in,p}$ provided at the first input port 102 becomes logic high at a third time 216, the intermediate (delayed) signal $V_{p,delay}$ remains at a logic low level as shown in the third graph 206 because that intermediate signal is a delayed version of the positive differential input signal $V_{in,p}$, as delayed by the tunable delay circuit 114 (and given that, in this example, the positive differential input signal $V_{in,p}$ had a low logic level prior to the third time 216). Accordingly, at the third time 216, the S terminal of the first latch 106 is at a high level (e.g., a "1") and the R terminal of the first latch is at a low level (e.g., a "0"). Given these inputs to the first latch 106, and consistent with Table 1, the first latch 106 in turn causes the output signal provided at the first output port 122, $V_{out,\,0°}$, to switch to a high level. That is, the Q terminal of the first latch 106 is set to high level (or "1" value according to Table 1) and thus the output value provided at the first output port 122 for $V_{out,0°}$ is also at a high level at the third time 216.

As is evident from a comparison of the first graph 202 and the second graph 204, the positive and negative differential input signals $V_{in,p}$ and $V_{in,p}$ have the same periodicity but are exactly (or substantially) 180 degrees out of phase with one another, with a single period corresponding to a time difference between the third time 216 and a fourth time 218. Further as shown by the second graph 204, the negative differential input signal $V_{in,n}$ provided at the second input port 104 becomes logic low at the third time 216. Additionally, the negative differential input signal $V_{in,n}$ remains logic low until a fifth time 220 that is a half period later (midway between the third time 216 and the fourth time 218). In this example embodiment, the tunable delay circuit 114 delays the positive differential input signal $V_{in,n}$ by a quarter period in producing the intermediate signal $V_{p,delay}$ communicated on the third linkage 118. Consequently, at a sixth time 222 midway in between the third time 216 and the fifth time 220, the intermediate signal $V_{p,delay}$ switches from logic low to logic high.

Given these differential input signals at the first and second input ports 102 and 104, and the delay provided by the tunable delay circuit 114, both of the S and R terminals of the second latch 108 receive low logic signals at the third time 216 and for a portion of time thereafter. Consequently, at the third time 216 and for a portion of time afterwards, the second latch 108 provides a logic low output at the Q terminal thereof such that, as shown in the fifth graph 210, the second output signal $V_{out,\,90°}$ has a low logic value at the third time and for a portion of time afterwards. However, at the sixth time 222 that is a quarter period after the third time 216, both of the first latch 106 and the second latch 108 switch states. More particularly, due to the switching of the intermediate signal $V_{p,delay}$ from logic low to logic high at the sixth time 222 as mentioned above, the output provided at the Q terminal of the first latch 106 switches from a logic high to a logic low at the sixth time, and the output provided at the Q terminal of the second latch 108 switches from logic low to logic high at the sixth time. Accordingly, at the sixth time 222, the output signal provided at the first output port 122, $V_{out,\,0°}$, is reset to a low level as shown in the fourth graph 208, and also the output signal provided at the second output port 124, $V_{out,\,90°}$, is set to a high level as shown in the fifth graph 210.

The outputs provided at the Q terminals for the first latch 106 and second latch 108, and correspondingly the output signals provided at the first second output ports 122 and 124, remain constant from the sixth time 222 up until the fifth time 220. However, when the negative differential input signal $V_{in,n}$ provided at the second input port 104 becomes logic high at the fifth time 220, this causes the second latch 108 to be reset (even though there is no change to the intermediate signal $V_{p,delay}$ at the fourth time). Thus, at the fifth time 220 as shown by the fifth graph 210, the second latch 108 switches the output at the Q terminal thereof from the logic high back to the logic low, such that the output signal provided at the second output port 124, $V_{out,\,90°}$, takes on a logic low level.

Further, from the fifth time 220 onward up until the fourth time 218, both of the first and second output signals $V_{out,\,0°}$ and $V_{out,\,90°}$ provided at the first and second output ports 122 and 124 remain at a low value. This is true even though the intermediate signal $V_{p,delay}$ has a falling edge 228, and thus returns to a low logic value, at a seventh time 230 midway between the fifth time 220 and the fourth time 218. Additionally, beginning at the fourth time 218, assuming that the positive and negative differential input signals $V_{in,p}$ and $V_{in,n}$ repeat in the same manners as described above between the third time 216 and the fourth time 218 (and given that the positive differential input signal $V_{in,p}$ had a low level prior to the third time 216 such that the intermediate signal $V_{p,delay}$ had a low level up to the sixth time 222), then the intermediate signal $V_{p,delay}$, the operations of the first and second latches 106 and 108, and the first and second output signals $V_{out,\,0°}$ and $V_{out,\,90°}$ will also repeat in the same (or substantially the same) manners as described above as occurring between the third time 216 and the fourth time 218.

As already mentioned, the first circuit 100 operates by way of a negative feedback loop that includes the LPF 134, the operational amplifier 136, and the tunable delay circuit 114. More particularly, it should be appreciated that the LPF 134 senses both of the first and second output signals (output voltage signals or output voltages) at the first and second output ports 122 and 124 (by way of the eighth and ninth linkages 138 and 140) and in turn presents filtered (average) voltages to the non-inverting terminal 142 and the inverting terminal 144 of the operational amplifier 136. As an example, FIG. 2 includes first and second dashed lines 224 and 226 that show example filtered (average) voltages based upon the first and second output signals $V_{out,\,0°}$ and $V_{out,\,90°}$, which respectively can be provided to the non-inverting terminal 142 and inverting terminal 144. Based upon these inputs at the non-inverting terminal 142 and the inverting terminal 144, the operational amplifier 136 provides an output signal at the output terminal 146 via the tenth linkage 148 to the tunable delay circuit 114. The output signal communicated to the tunable delay circuit 114 via the tenth linkage 148 adjusts the delay provided by the tunable delay circuit, between the positive differential input signal $V_{in,p}$ and the intermediate signal $V_{p,delay}$ until the filtered voltages applied to the non-inverting terminal 142 and the inverting terminal 144 become equal. When this condition occurs, the phase difference between the first output signal $V_{out,\,0°}$ and the second output signal $V_{out,\,90°}$ provided respectively at the first and second output ports 122 and 124 is exactly 90°. Also, when this condition occurs, each of the first output signal $V_{out,0°}$ and the second output signal $V_{out,\,90°}$ has a 25% duty cycle when the duty cycle of each of the positive and negative differential input signals $V_{in,p}$ and $V_{in,n}$ is 50%.

In view of the above discussion, it will be appreciated that the operation of the first circuit 100 can be characterized as follows. First, the rising edge of the positive differential input signal $V_{in,p}$ received at the first input port 102 determines the rising edge of the first output signal at the first output port 122, $V_{out,\,0°}$ (e.g., at the third time 216). Further, the rising edge of the negative differential input signal $V_{in,n}$ received at the second input port 104 determines the falling edge of the second output signal at the second output port 124, $V_{out,\,90°}$ (e.g., at the fifth time 220). Additionally, operation of the feedback loop provided by the LPF 134, operational amplifier 136, and tunable delay circuit 114 determines the falling edge of the first output signal at the first output port 122, $V_{out,\,0°}$ (e.g., at the sixth time 222), and also determines the rising edge of the second output signal at the second output port 124, $V_{out,\,90°}$ (e.g., also at the sixth time 222).

Figure 6:
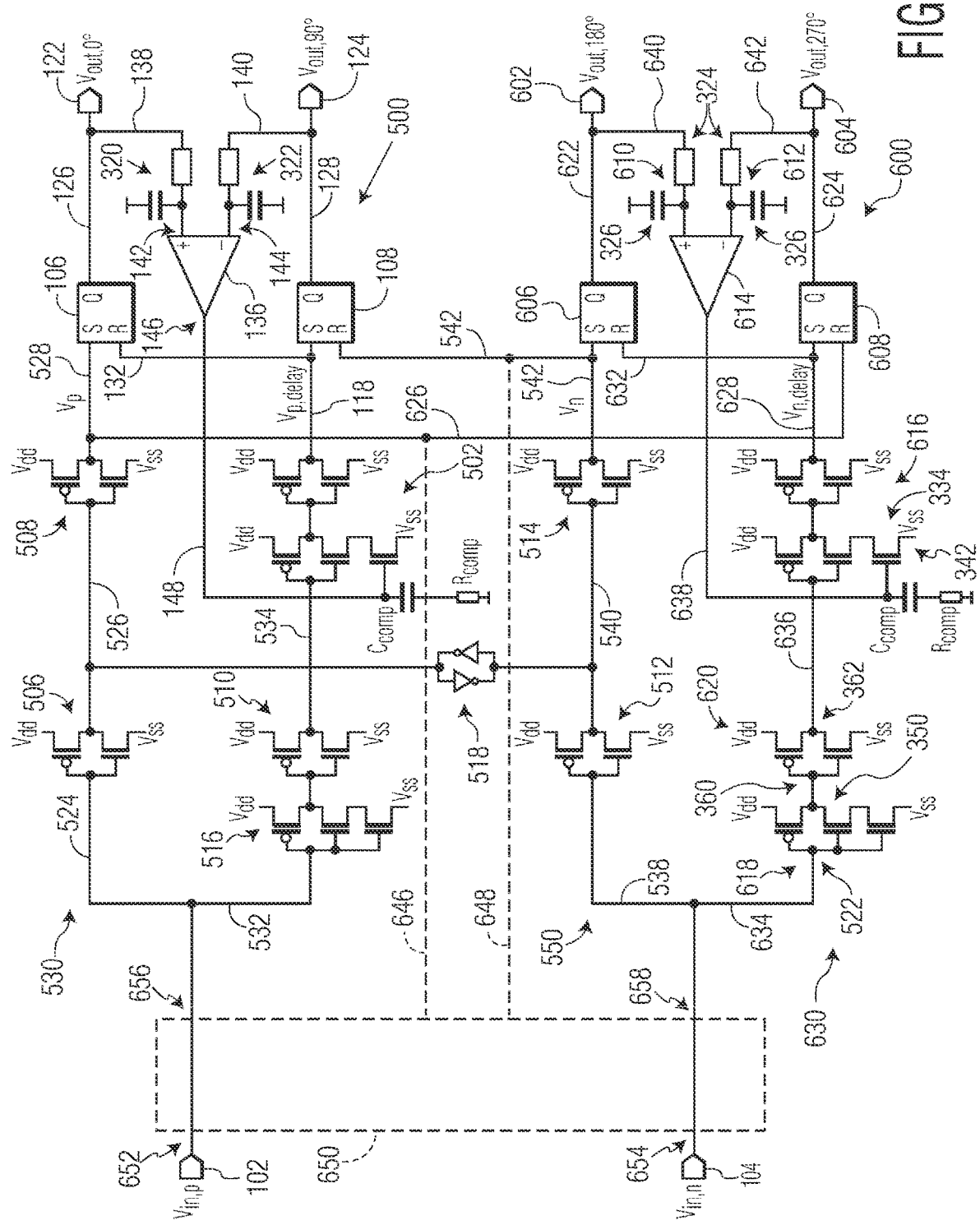
FIG. 6 is a schematic diagram showing a four-phase generator circuit that is configured to generate four output signals based upon differential input signals, where the four output signals are successively out of phase with one another by 90 degree phase shifts, in accordance with a fourth example embodiment encompassed herein.

As mentioned above, the first circuit 100 can serve as one of a pair of cores (circuits or subcircuits) that in combination can together form a four-phase generator. FIG. 6 as described below shows in more detail how two cores can be combined to form a four-phase generator in one example embodiment. However, it should be appreciated that a four-phase generator can also be formed from two cores taking the form of the first circuit 100 of FIG. 1 by adding and coupling to the first circuit 100 an additional circuit that is identical to the first circuit, except insofar as: (1) the input ports of the additional circuit will be reversed in terms of whether the respective input ports receive the positive and negative differential input signals $V_{in,p}$ and $V_{in,n}$ (e.g., such that the counterpart first and second linkages 110 and 116 of the additional circuit will be directly coupled to the input port at which the negative differential input signal $V_{in,n}$ is received); (2) the R terminal of the second latch 108 of the first circuit 100 will additionally be directly coupled to the S terminal of the counterpart first latch of the additional circuit; (3) the R terminal of the counterpart second latch of the additional circuit will additionally be directly coupled to the S terminal of the first latch 106 of the first circuit 100; and (4) the additional circuit will include two additional output ports that are in addition to the first and second output ports 122 and 124 of the first circuit 100, so that the combined circuit includes four output ports.

Figure 3:
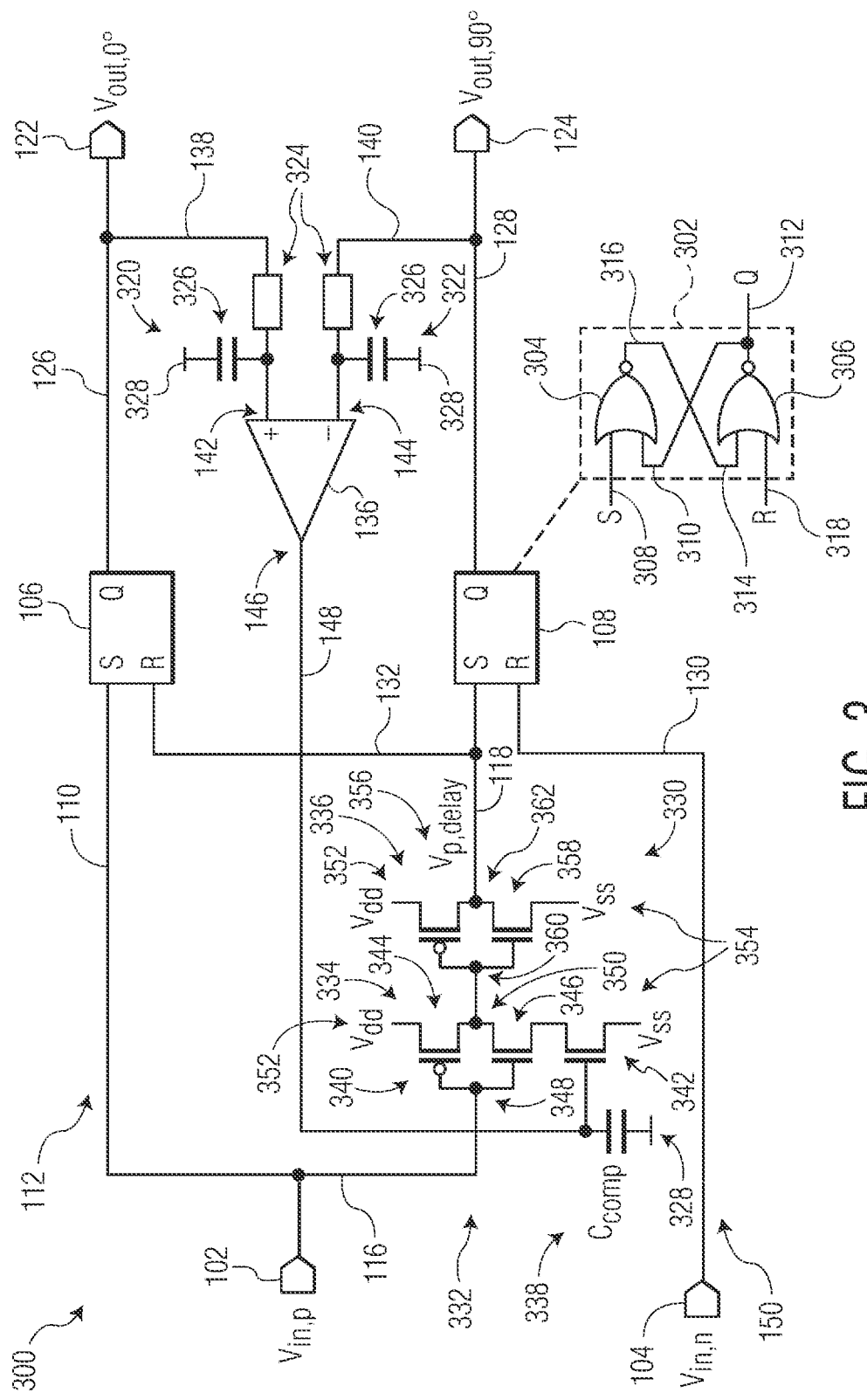
FIG. 3 is a schematic diagram showing a second circuit that is configured to generate, based upon differential input signals, a pair of output signals that are respectively out of phase with one another by 90 degrees, and that can serve as one of a pair of cores (circuits or subcircuits) that in combination can together form a four-phase generator, in accordance with a second example embodiment encompassed herein.

Turning to FIG. 3, a schematic diagram shows a second circuit 300 that also can serve as one of a pair of cores (circuits or subcircuits) that in combination can together form a four-phase generator. The second circuit 300 can be considered to constitute a first example embodiment of the first circuit 100 and again is configured to generate, based upon differential input signals (each having 50% duty cycles), a pair of output signals that are respectively out of phase with one another by 90 degrees. FIG. 3 particularly illustrates in more detail certain example circuit components that can be implemented as the LPF 134, second latch 108, and tunable delay circuit 114. It will be appreciated that, aside from what is shown regarding the LPF 134, second latch 108, and tunable delay circuit 114, the second circuit 300 otherwise is identical to the first circuit 100. In particular, the second circuit 300 includes the first input port 102, the second input port 104, the first latch 106, the second latch 108, the first linkage 110 and first main signal path 112 provided thereby, the second linkage 116, the third linkage 118, the first output port 122, the second output port 124, the fourth linkage 126, the fifth linkage 128, the sixth linkage 130 and second main signal path 150 provided thereby, the seventh linkage 132, the operational amplifier 136, the non-inverting input port 142, the inverting input port 144, the output port 146, the eighth linkage 138, the ninth linkage 140, and the tenth linkage 148.

With respect to the second latch 108, FIG. 3 particularly shows in a schematic matter an example circuit 302 illustrating example internal components of that latch 108. Although not shown in detail, it should be appreciated that the first latch 106 also can take exactly the same form as the example circuit 302 of FIG. 3, although this need not be the case in all embodiments. In the present embodiment, each of the second latch 108 and first latch 106 is a SR latch (particularly a reset-dominant SR latch), and can be implemented with two NOR circuits. More particularly as shown in FIG. 2, the second latch 108 is formed by first and second NOR gates 304 and 306 coupled with one another. A first input port 308 of the first NOR gate 304 constitutes the S (set) terminal of the second latch 108, and a second input port 310 of the first NOR gate 306 is coupled directly to an output port 312 of the second NOR gate 306, which also constitutes the Q (output) terminal of the second latch 108. Additionally, a first input port 314 of the second NOR gate 306 is coupled directly to an output port 316 of the first NOR gate 304, and a second input port 318 constitutes the R (reset) terminal of the second latch 108. Notwithstanding the above description, it should be appreciated that the second latch 108, as well as the first latch 106, can be implemented in other manners differing from that shown in FIG. 3 by the example circuit 302, depending upon the embodiment.

Further as shown, the second circuit 300 includes a first RC network 320 and a second RC network 322 that, in combination, can be understood as constitute an example embodiment of the LPF 134 of the first circuit 100. Each of the first and second RC networks 320 and 322 is identical (or substantially identical) in structure and includes a respective resistor 324 and a respective capacitor 326. The respective resistor 324 of the first RC network 320 is coupled between the eighth linkage 138 and the non-inverting input port 142, and the respective capacitor 326 of the first RC network 320 is coupled between the non-inverting input port and a supply voltage 328 (or alternatively to a ground voltage or to some other voltage or source node or location). The respective resistor 324 of the second RC network 322 is coupled between the ninth linkage 140 and the inverting input port 144, and the respective capacitor 326 of the second RC network 322 is coupled between the inverting input port and the supply voltage 328 (or alternatively to a ground voltage or to some other voltage or source node or location).

Additionally, the second circuit 300 is shown to include several circuit components that together in operation form a tunable delay circuit 330 (or tunable delay cell). The combination of the tunable delay circuit 330, along with the second linkage 116 and the third linkage 118, can also be considered to form a delayed path 332, which can be considered a first example embodiment of the delayed path 120 of FIG. 1. Although the tunable delay circuit 330 and delayed path 332 can respectively be considered first example embodiments of the tunable delay circuit 114 and delayed path 120 of FIG. 1, it should be understood that the present disclosure is intended to encompass a variety of other embodiments of tunable delay circuits or delayed paths (and associated component arrangements) in addition to the particular arrangements of components forming the tunable delay circuit 330 and delayed path 332 of FIG. 3.

More particularly, in the example embodiment of FIG. 3, the tunable delay circuit 330 includes a delay control circuit 334, an inverter 336, and a capacitor 338, where the delay control circuit and the inverter are coupled between the second linkage 116 and the third linkage 118. The delay control circuit 334 includes a CMOS (complementary metal-oxide-semiconductor) inverter 340 coupled in series with a NMOS (N-type metal-oxide-semiconductor) transistor 342, which more particularly is a type of MOSFET (metal-oxide-semiconductor field effect transistor). The CMOS inverter 340 includes both a PMOS (P-type metal-oxide-semiconductor) transistor 344 coupled to a complementary NMOS transistor 346, where each of those PMOS and NMOS transistors also is a MOSFET. The respective gates of the PMOS and NMOS transistors 344 and 346 are coupled together to form an input port 348 of the delay control circuit 334 (and of the tunable delay circuit 330 overall), which is coupled to the second linkage 116 so as to receive the positive differential input signal $V_{in,p}$. The respective drain of the PMOS transistor 344 is coupled together with the respective drain of the NMOS transistor 346 to form an output port 350 of the delay control circuit 334, which is coupled to the inverter 336. The respective source of the PMOS transistor 344 is coupled to a supply voltage 352 ($V_{dd}$), which can be (but need not be) the same voltage as the supply voltage 328 mentioned above. The respective source of the NMOS transistor 346 is coupled to the respective drain of the NMOS transistor 342, and the respective source of the NMOS transistor 342 is coupled to a ground voltage 354 ($V_{ss}$).

Further as shown, the gate terminal of the NMOS transistor 342 constitutes a feedback input port of the tunable delay circuit 330 and is coupled to the tenth linkage 148 so as to receive feedback signals from the operational amplifier 136. The capacitor 338, which has a capacitance $C_{comp}$, also couples the gate terminal of the NMOS transistor 342 (and therefore also the tenth linkage 148) to the supply voltage 328 (or alternatively to a ground voltage or to some other voltage or source node or location). Additionally, in the present embodiment, the inverter 336 also is a CMOS inverter that takes the same form as the CMOS inverter 340 and therefore includes a PMOS transistor 356 coupled to a complementary NMOS transistor 358 (each of which again is a MOSFET). The respective gates of the PMOS and NMOS transistors 356 and 358 are coupled together to form an input port 360 of the inverter 336, which is directly coupled to the output port 350 of the delay control circuit 334. The respective drain of the PMOS transistor 356 is coupled together with the respective drain of the NMOS transistor 358 to form an output port 362 of the inverter 336 (and of the tunable delay circuit 330 overall), which is coupled to the third linkage 118 to provide an intermediate signal $V_{p,\ delay}$ for receipt by the second latch 108. The respective source of the PMOS transistor 356 is coupled to the supply voltage 352 ($V_{dd}$), and the respective source of the NMOS transistor 358 is coupled to a ground voltage 354 ($V_{ss}$).

It should be appreciated that it is the delay control circuit 334 of the tunable delay circuit 330, including particularly the CMOS inverter 340 and NMOS transistor 342, which governs the time delay (or phase shift) that occurs from the positive differential input signal $V_{in,p}$ to the intermediate signal $V_{p,\ delay}$. The NMOS transistor 342 of the tunable delay circuit 330 particularly operates to control the discharge current with its gate-source voltage based upon the feedback from the operational amplifier 136 provided via the tenth linkage 148. The NMOS transistor 342 thus governs the signal delay introduced by the delay control circuit 334 and the CMOS inverter thereof 340—that is, the signal delay between the input port 348 and the output port 350. The inverter 336, although included as part of the tunable delay circuit 330, is placed after the delay control circuit 334 (in between the delay control circuit and the third linkage 118) to make the overall delay transfer non-inverting and to ensure fast edges at both of the inputs (particularly the R inputs) of the first and second latches 106 and 108. Additionally, the capacitor 338 having capacitance $C_{comp}$ can be added to stabilize the negative-feedback loop.

Figure 4:
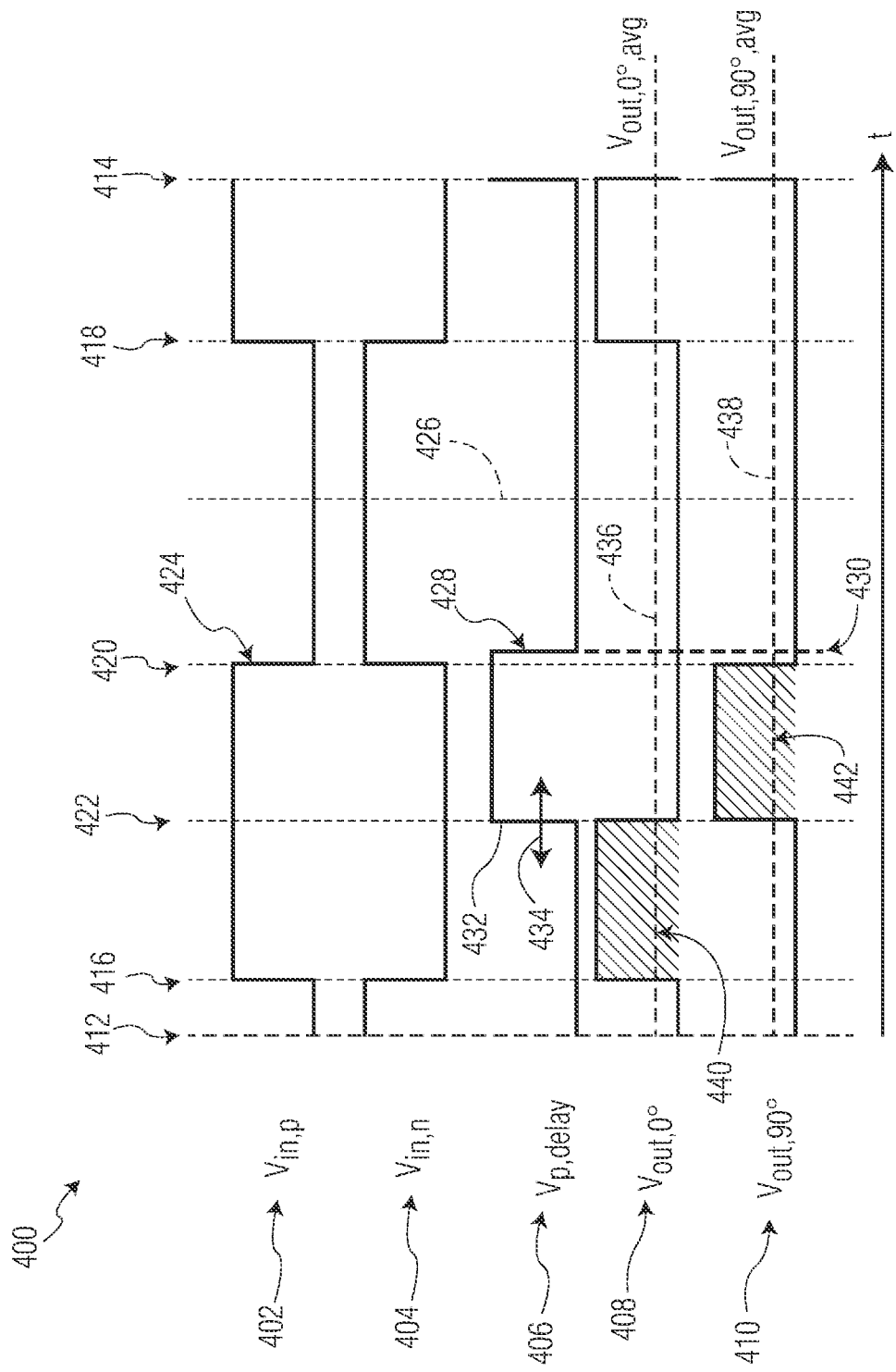
FIG. 4 is a timing diagram illustrating example variations, over a portion of time, of the differential input signals, output signals, and an intermediate delayed signal communicated within the second circuit of FIG. 3.

Referring additionally to FIG. 4, a timing diagram 400 illustrates in greater detail example operation of the second circuit 300 in terms of generating the first and second output signals $V_{out,\ 0°}$ and $V_{out,\ 90°}$ based upon the positive and negative differential input signals $V_{in,p}$ and $V_{in,n}$. Similar to the timing diagram 200 of FIG. 2, the timing diagram 400 particularly includes shows each of a first graph 402, a second graph 404, a third graph 406, a fourth graph 408, and a fifth graph 410. The first graph 402 shows an example excerpt of the positive differential input signal $V_{in,p}$ (received at the first input port 102 of the second circuit 300) over a first time period, from a first time 412 to a second time 414, and the second graph 404 shows an example excerpt of the negative differential input signal $V_{in,n}$ (received at the second input port 104 of the second circuit 300) contemporaneously occurring over that same first time period. The third graph 406 shows an example excerpt of the intermediate signal $V_{p,\ delay}$ that is communicated along the third linkage 118 of the second circuit 300 contemporaneously with the aforementioned excerpts of the positive and negative differential input signals during the first time period from the first time 412 to the second time 414. Further, the fourth graph 208 shows an example excerpt of the first output signal $V_{out,\ 0°}$ (provided at the first output port 122 of the second circuit 300) and the fifth graph 410 shows an example excerpt of the second output signal $V_{out,\ 90°}$ (provided at the second output port 124 of the second circuit 300), both contemporaneously occurring over that same first time period between the first time 412 and second time 414.

It should be appreciated that the first and second graphs 402 and 404 respectively are identical to the first and second graphs 202 and 204 of FIG. 2, respectively, in terms of the variation of the respective input signals over time. In particular, each of the positive and negative differential input signals $V_{in,p}$ and $V_{in,n}$ oscillate with a period corresponding to the difference between a third time 416 and a fourth time 418. The positive differential signal switches from a logic low level to a logic high level at the third time 416 and the fourth time, and switches back to the logic low level at a fifth time 420 midway between the third and fourth times, and the negative differential signal (which is 180 degrees out of phase with the positive differential signal) switches at the same times but in the opposite directions, respectively. Further, it should be appreciated that the fourth and fifth graphs 408 and 410 respectively are identical to the fourth and fifth graphs 208 and 210 of FIG. 2, respectively, in terms of the variation of the first and second output signals $V_{out,\ 0°}$ and $V_{out,\ 90°}$ provided at the first and second output ports 122 and 124, respectively, over time. Again, each of the first and second output signals $V_{out,\ 0°}$ and $V_{out,\ 90°}$ is shown to have a 25% duty cycle, with the respective output signals having rising edges at the third time 416 and a sixth time 422, respectively, and falling edges at the sixth time and fifth time 420, respectively.

However, in contrast to the third graph 206 of FIG. 2, the third graph 406 shows the intermediate signal $V_{p,\ delay}$ (provided by the tunable delay circuit 330 on the third linkage 118) to be somewhat different than the intermediate signal illustrated by the third graph 206 of FIG. 2. Again, at the sixth time 422 midway in between the third time 416 and the fifth time 420, the intermediate signal $V_{p,delay}$ switches from logic low to logic high. However, although the intermediate signal $V_{p,delay}$ illustrated by the third graph 206 of FIG. 2 included the falling edge 228 at the seventh time 230 midway between the fifth time 220 and the fourth time 218, a falling edge 428 of the intermediate signal $V_{p,delay}$ shown by the third graph 406 of FIG. 4 occurs at a seventh time 430 that occurs shortly after the fifth time 420, well before an eighth time 426 midway between the fifth time 420 and the fourth time 418. This difference between the third graphs 406 and 206 demonstrates that the intermediate signal $V_{p,delay}$ can experience variation in terms of when its falling edges occur, albeit the falling edges typically (or always) arrive later than the positive differential input signal $V_{in,p}$—for example, the falling edge 428 occurs after a falling edge 424 of the positive differential input signal occurring at the fifth time 420 shown in the first graph 402. Further, given that the fourth and fifth graphs 408 and 410 respectively are identical to the fourth and fifth graphs 208 and 210, the difference between the third graphs 406 and 206 also demonstrates that such variations in the timing of the falling edges of the intermediate signal $V_{p,delay}$ generally do not produce changes in the resulting first and second output signals provided at the first and second output ports 122 and 124, $V_{out,0°}$ and $V_{out,\ 90°}$, respectively. Such operation is desirable in that it prevents metastability for the first latch 108.

Although variations in the timing of the falling edges of the intermediate signal $V_{p,delay}$ generally do not affect the first and second output signals $V_{out,0°}$ or $V_{out,\ 90°}$, variations in the rising edges of the intermediate signal $V_{p,\ delay}$ do affect those output signals. Indeed, the rising edges of the intermediate signal $V_{p,delay}$ constitute the trigger points at which the second output signal provided at the second output port 124 ($V_{out,90°}$) is set and at which the first output signal provided at the first output port 122 ($V_{out,\ 0°}$) is reset. This is true both with respect to the third circuit 300 of FIG. 3 and also with respect to the first circuit 100 of FIG. 1. Further, it is the delay provided by the tunable delay circuit 330 of FIG. 3 (or the tunable delay circuit 114 of FIG. 1) that particularly determines the timing of the rising edges of the intermediate signal $V_{p,delay}$. In the present embodiment, adjustments of the rising edge(s) of the intermediate signal $V_{p,delay}$ as determined by the tunable delay circuit 330, in response to feedback from the operational amplifier 136 based at least indirectly (e.g., after low-pass filtering) upon the differences in the first and second output signals $V_{out,\ 0°}$ and $V_{out,90°}$, are what tend to drive those output signals over time toward being 90 degrees out of phase.

As with the first circuit 100 above, the second circuit 300 provides feedback to achieve operation as described above by way of a negative feedback loop that includes the RC networks 320 and 322 (corresponding to the LPF 134), the operational amplifier 136, and the tunable delay circuit 330. More particularly, the respective first and second RC networks 320 and 322 respectively present filtered (average) voltages to the non-inverting terminal 142 and the inverting terminal 144 of the operational amplifier 136, respectively. As an example, FIG. 4 includes first and second dashed lines 436 and 438 that show example filtered (average) voltages based upon the first and second output signals $V_{out,\ 0°}$ and $V_{out,\ 90°}$ shown by the fourth and fifth graphs 408 and 410, and those filtered voltages respectively can be provided to the non-inverting terminal 142 and inverting terminal 144. Based upon these inputs at the non-inverting terminal 142 and the inverting terminal 144, the operational amplifier 136 provides an output signal at the output terminal 146 via the tenth linkage 148 to the tunable delay circuit 330.

The output signal communicated to the tunable delay circuit 330 via the tenth linkage 148 adjusts the delay provided by the tunable delay circuit, between the positive differential input signal $V_{in,p}$ and the intermediate signal $V_{p,delay}$, until the filtered voltages applied to the non-inverting terminal 142 and the inverting terminal 144 become equal. When this condition occurs, the phase difference between the first output signal $V_{out,0°}$ and the second output signal $V_{out,\ 90°}$ provided respectively at the first and second output ports 122 and 124 is exactly 90°. Also, when this condition occurs, each of the first output signal $V_{out,0°}$ and the second output signal $V_{out,\ 90°}$ has a 25% duty cycle (when the duty cycle of each of the positive and negative differential input signals $V_{in,p}$ and $V_{in,n}$ is 50%). Further, when this condition occurs, a first area 440 under the fourth graph 408 becomes equal to a second area 442 under the fifth graph 410.

As already mentioned above, it is adjustments of the rising edge(s) of the intermediate signal $V_{p,delay}$ as determined by the tunable delay circuit 330 (in response to feedback from the operational amplifier 136) that tend to drive the first and second output signals $V_{out,\ 0°}$ and $V_{out,\ 90°}$ over time toward being 90 degrees out of phase relative to one another. If the third circuit 300 (or first circuit 100) is operating as intended so that those outputs signals are 90 degrees out of phase relative to one another, then in the example of FIG. 4 the rising edge 432 occurs at the time 422, such that the first area 440 under the fourth graph 408 is equal to the second area 442 under the fifth graph 410. However, in a circumstance when there is an error (e.g., due to offset in the operational amplifier 136), the rising edge can occur at a time that deviates from the time 422. To illustrate this possible circumstance, even though the third graph 406 illustrates the intermediate signal $V_{p,delay}$ as having the rising edge 432 occurring at the sixth time 422, FIG. 4 also shows that the rising edge 432 can occur at earlier or later times as represented by a double-headed arrow 434. Such variations in the timing of rising edges as represented by the double-headed arrow 434 can depend upon the delays provided by the tunable delay circuit 300 in response to the feedback signals provided by the operational amplifier 136. When such variations in the timing of rising edges such as the rising edge 432 occur, the second area 442 (or corresponding areas associated with particular rising edges) will become smaller than the first area 440 (or corresponding areas), or vice-versa, which will result in output phase errors. Such output phase errors will in turn cause changes in the feedback provided by the operational amplifier 136, which will ultimately tend to reduce and eliminate such phase errors as operation continues. (Thus, the double-headed arrow 434 indicates changes in the rising edge times that can occur when errors arise, but the double-headed arrow is not intended to indicate other operating points that satisfy the desired 90 degrees phase relation of the output signals.)

As with the first circuit 100, it will be appreciated that the operation of the second circuit 300 can be characterized as follows. First, the rising edge of the positive differential input signal $V_{in,p}$ received at the first input port 102 determines the rising edge of the first output signal at the first output port 122, $V_{out,0°}$ (e.g., at the third time 416). Further, the rising edge of the negative differential input signal $V_{in,n}$ received at the second input port 104 determines the falling edge of the second output signal at the second output port 124, $V_{out, 90°}$ (e.g., at the fifth time 420). Additionally, operation of the feedback loop provided by the RC networks 320 and 322, operational amplifier 136, and tunable delay circuit 330 determines the falling edge of the first output signal at the first output port 122, $V_{out, 0°}$ (e.g., at the sixth time 222), and also determines the rising edge of the second output signal at the second output port 124, $V_{out, 90°}$ (e.g., also at the sixth time 222).

It should additionally be understood that there is only a single operating point for the negative-feedback loop where both of the input voltages applied to the non-inverting terminal 142 and inverting terminal 144 of the operational amplifier 136 are equal (assuming that the tuning delay circuit/delay cell has sufficient control range). Therefore the loop cannot end up in a false locking condition. (Indeed, a DC sweep of the tuning voltage signal vs the average output voltages would show that the two signals are only equal at a single operating point, showing that there are no false locking conditions.) If for example the output signal provided by the operational amplifier 136 at the output terminal 146 is 0 Volts, then the input signals to the S and R input terminals of the first latch 106 respectively will be S=low/high (toggles) and R=low, and additionally the input signals to the S and R terminals of the second latch 108 will be S=low, R=high/low. In such case, the output signal provided at the first output port 122 $V_{out, 0°}$ will be logic high as soon as S=high, and the output signal provided at the second output port 124 $V_{out, 90°}$ will logic low as soon as R=high. In such a circumstance, the input voltage ($V_{amp,in,p}$) applied to the non-inverting terminal 142 will be greater than the input voltage ($V_{amp,in,n}$) applied to the inverting terminal 144 (that is, $V_{amp,in,p} > V_{amp,in,n}$) and so the tuning voltage (e.g., the output signal provided from the output port 146 of the operational amplifier 136 to the tuning delay circuit 330) increases until the delay corresponds to a 90° phase shift between the two output signal $V_{out, 0°}$ and $V_{out, 90°}$.

As mentioned above, the third circuit 300 can serve as one of a pair of cores (circuits or subcircuits) that in combination can together form a four-phase generator. FIG. 6 as described below shows in more detail how two cores can be combined to form a four-phase generator in one example embodiment. However, it should be appreciated that a four-phase generator can also be formed from two cores taking the form of the first circuit 300 of FIG. 1 by adding and coupling to the first circuit 300 an additional circuit that is identical to the first circuit, except insofar as: (1) the input ports of the additional circuit will be reversed in terms of whether the respective input ports receive the positive and negative differential input signals $V_{in,p}$ and $V_{in,n}$ (e.g., such that the counterpart first and second linkages 110 and 116 of the additional circuit will be directly coupled to the input port at which the negative differential input signal $V_{in,n}$ is received); (2) the R terminal of the second latch 108 of the third circuit 300 will additionally be directly coupled to the S terminal of the counterpart first latch of the additional circuit; (3) the R terminal of the counterpart second latch of the additional circuit will additionally be directly coupled to the S terminal of the first latch 106 of the third circuit 300; and (4) the additional circuit will include two additional output ports that are in addition to the first and second output ports 122 and 124 of the third circuit 300, so that the combined circuit includes four output ports.

Figure 5:
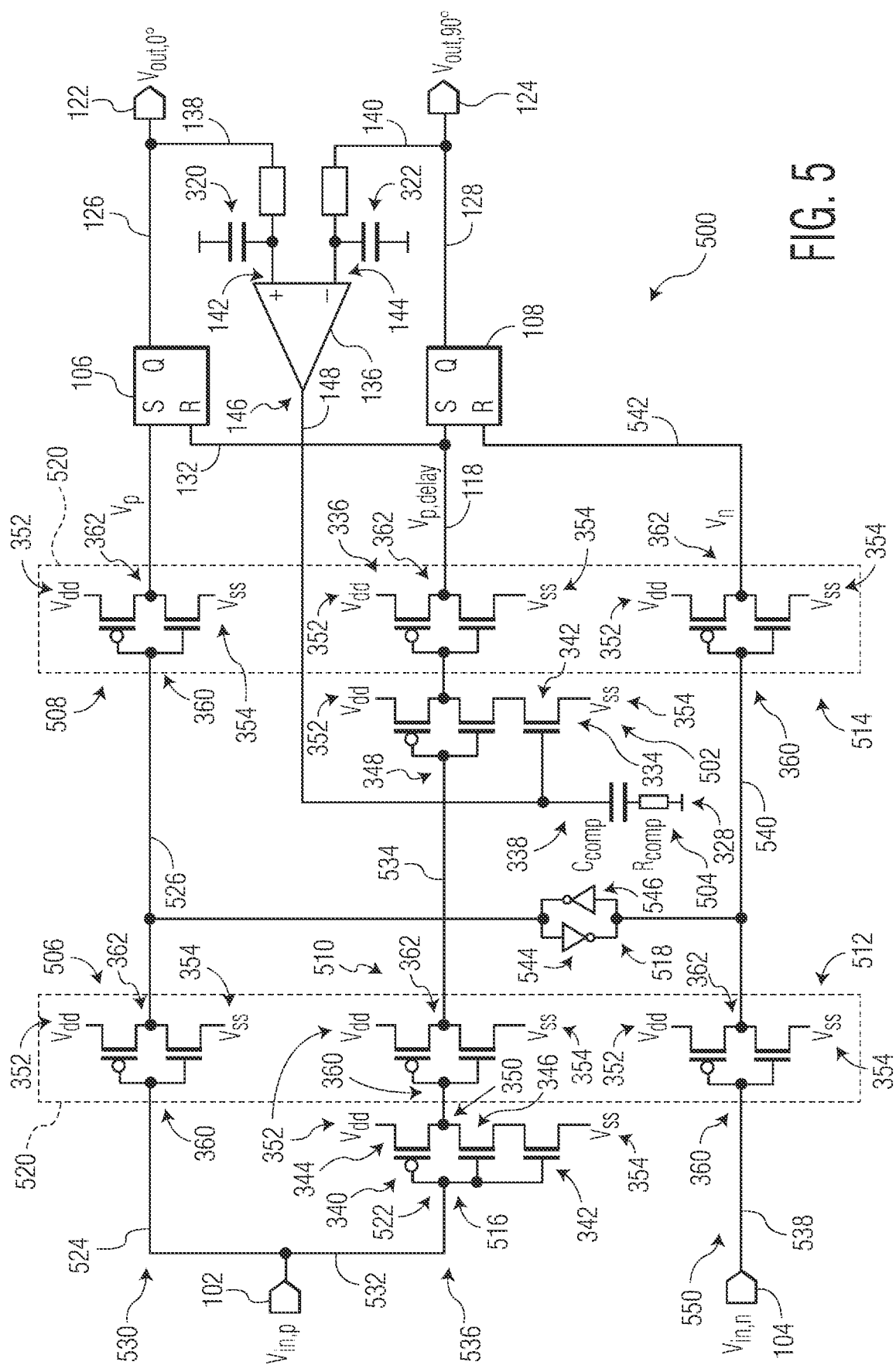
FIG. 5 is a schematic diagram showing a third circuit that is configured to generate, based upon differential input signals, a pair of output signals that are respectively out of phase with one another by 90 degrees, and that can serve as one of a pair of cores (circuits or subcircuits) that in combination can together form a four-phase generator, in accordance with a third example embodiment encompassed herein.

Referring next to FIG. 5, a schematic diagram shows a third circuit 500 that also can serve as one of a pair of cores (circuits or subcircuits) that in combination can together form a four-phase generator. As with the first circuit 100 and second circuit 300, the third circuit 500 again is configured to generate, based upon differential input signals (each having 50% duty cycles), a pair of output signals that are respectively out of phase with one another by 90 degrees. The third circuit 500 shares in common many of the same components and component arrangements that are present in the second circuit 300. In particular, the third circuit 500 includes the first input port 102, the second input port 104, the first latch 106, the second latch 108, the third linkage 118, the first output port 122, the second output port 124, the fourth linkage 126, the fifth linkage 128, the seventh linkage 132, the operational amplifier 136, the non-inverting input port 142, the inverting input port 144, the output port 146, the eighth linkage 138, the ninth linkage 140, the tenth linkage 148, and the first and second RC networks 320 and 322. The first RC network 320 again is coupled to each of the eighth linkage 138, the non-inverting input port 142 and the supply voltage 328 (or alternatively to a ground voltage or to some other voltage or source node or location), and the second RC network 322 again is coupled to each of the ninth linkage 140, the inverting input port 144 and the supply voltage (or alternative voltage or source node or location).

Additionally, the third circuit 500 includes a tunable delay circuit 502 that is identical to the tunable delay circuit 330 except insofar as the tunable delay circuit 502 additionally includes a resistor 504 having a resistance $R_{comp}$ coupled between the capacitor 338 and the supply voltage 328 (or alternatively ground voltage or some other voltage or source node or location). That is, as with the tunable delay circuit 330, the tunable delay circuit 502 includes each of the delay control circuit 334, the inverter 336, and the capacitor 338, each of which includes the same components and are coupled with one another in the same manner as described in regard to FIG. 3. In particular as shown, the gate terminal of the NMOS transistor 342 of the delay control circuit 334 again constitutes a feedback input port of the tunable delay circuit 502 and is coupled to the tenth linkage 148 so as to receive feedback signals from the operational amplifier 136. The capacitor 338 also is coupled to the gate terminal of the NMOS transistor 342 but, in this embodiment, is coupled between that gate terminal and the resistor 504, which in turn is coupled between that capacitor and the supply voltage 328 (or alternative voltage or source node or location). Further, each of the delay control circuit 334 and the inverter 336 are coupled between the supply voltage 352 ($V_{dd}$), and the ground voltage 354 ($V_{ss}$) in the same manners as discussed above in regard to FIG. 3. Additionally, as with the tunable delay circuit 330, the output port 362 of the inverter 336 of the tunable delay circuit 502 is coupled to the third linkage 118 to provide an intermediate signal $V_{p,\,delay}$ for receipt by the second latch 108.

Notwithstanding these similarities between the third circuit 500 and the second circuit 300, the third circuit of FIG. 5 does differ from the second circuit in a number of manners and particularly includes several additional components. In contrast to the second circuit 300, although the tunable delay circuit 502 of the third circuit 500 again includes the input port 348 for receipt of an input signal, that input port is not in this embodiment coupled directly to the first input port 102. Likewise, in contrast to the second circuit 300, the S terminal of the first latch 106 is not directly coupled to the first input port 102, nor is the R terminal of the second latch 108 directly coupled to the second input port 104. Instead of coupling the tunable delay circuit 502 and first and second latches 106 and 108 directly to the first and second input ports 102 and 104, the third circuit 500 additionally includes several intermediate components by which the tunable delay circuit and latches are coupled to the first and second input ports.

More particularly in this regard, the third circuit 500 includes first, second, third, fourth, and fifth inverters 506, 508, 510, 512, and 514, respectively, a fixed delay circuit 516, and an edge aligner circuit 518. Each of the first, second, third, fourth, and fifth inverters 506, 508, 510, 512, and 514 can take the same form as the inverter 336, namely, that of a CMOS inverter having the input port 360 and the output port 362 and coupled between the supply voltage 352 ($V_{dd}$), and the ground voltage 354 ($V_{ss}$) as discussed above in regard to FIG. 3. Also, each of the first, second, third, fourth, and fifth inverters 506, 508, 510, 512, and 514 can be matched with one another and with the inverter 336 of the tunable delay circuit 502. Dashed boxes 520 are particularly shown in FIG. 5 to identify (encircle) all of the matched inverters. Alternatively, each of the second inverter 508 and fifth inverter 514 can be matched with the inverter 336 of the tunable delay circuit 502 and each of the first, third, and fourth inverters 506, 510, and 512 can be matched with one another (if not also with matched with the inverter 336 of the tunable delay circuit). As for the fixed delay circuit 516, this circuit is identical to the delay control circuit 334 (of FIGS. 3 and 5) except for the input node of the circuit. That is, the fixed delay circuit 516 includes each of the CMOS inverter 340 and NMOS transistor 342 coupled together and between the supply voltage 352 ($V_{dd}$) and ground voltage 354 ($V_{ss}$), and includes the output port 350, which in this case is directly coupled to the input port 360 of the third inverter 510. However, in contrast to the delay control circuit 334, each of the gates of each of the PMOS transistor 344, NMOS transistor 346, and the NMOS transistor 342 are all coupled together to form an input port 522 of the fixed delay circuit.

The tunable delay circuit 502 and first and second latches 106 and 108 are coupled to the first and second input ports 102 and 104 by way of the first, second, third, fourth, and fifth inverters 506, 508, 510, 512, and 514 and the fixed delay circuit 516 as follows. First, to couple the first input port 102 with the S terminal of the first latch 106, the first input port 102 is directly coupled to the input port 360 of the first inverter 506 by way of an eleventh linkage 524, the output port 362 of the first inverter 506 is directly coupled to the input port 360 of the second inverter 508 by way of a twelfth linkage 526, and the output port 362 of the second inverter 508 is directly coupled to the S terminal of the first latch 106 by way of a thirteenth linkage 528. This arrangement can be considered to form a first main signal path 530 between the first input port 102 and the first latch 106. It should be recognized that the first main signal path 530, due to the first and second inverters 506 and 508, does involve the introduction of some delay in the communication of the positive differential input signal $V_{in,p}$ received at the first input port 102 to the first latch 106. Consequently, as shown, the signal received at the S terminal of the first latch can be referred to as a delayed positive differential input signal $V_p$.

Second, to couple the first input port 102 with the input port 348 of the tunable delay circuit 502, the first input port 102 is directly coupled to the input port 522 of the fixed delay circuit 516 by way of a fourteenth linkage 532, the output port 350 of the fixed delay circuit is directly coupled to the input port 360 of the third inverter 510 as noted previously, and the output port 362 of the third inverter 510 is directly coupled to the input port 348 by way of a fifteenth linkage 534. This arrangement can be considered to form a delayed signal path 536 between the first input port 102 and the first latch 106 (it being appreciated that, in this embodiment, there is also some delay that arises along the main signal path 530).

Third, to couple the second input port 104 with the R terminal of the second latch 108, the second input port 104 is directly coupled to the input port 360 of the fourth inverter 512 by way of a sixteenth linkage 538, the output port 362 of the fourth inverter 512 is directly coupled to the input port 360 of the fifth inverter 514 by way of a seventeenth linkage 540, and the output port 362 of the fifth inverter 514 is directly coupled to the R terminal of the second latch 108 by way of an eighteenth linkage 542. This arrangement can be considered to form a second main signal path 550 between the second input port 104 and the second latch 108. It should be recognized that the second main signal path 550, due to the fourth and fifth inverters 512 and 514, does involve the introduction of some delay in the communication of the negative differential input signal $V_{in,n}$ received at the second input port 104 to the second latch 108. Consequently, as shown, the signal received at the R terminal of the second latch can be referred to as a delayed negative differential input signal $V_n$.

As noted above, the third circuit 500 additionally includes the edge aligner circuit 518. As illustrated in FIG. 5, the edge aligner circuit 518 is a back-to-back inverter arrangement that includes a sixth inverter 544 and a seventh inverter 546 that are coupled in a back-to-back manner between the twelfth linkage 526 and the seventeenth linkage 540.

Although not shown in detail, each of the sixth and seventh inverters 544 and 546 can include the same components as the inverter 336. In the present example, the input port of the sixth inverter 544 and the output port of the seventh inverter 546 are both directly coupled to the twelfth linkage 526, and the output port of the sixth inverter 544 and the input port of the seventh inverter 546 are both directly coupled to the seventeenth linkage 540. Given this arrangement, the input port of the sixth inverter 544, output port of the seventh inverter 546, output port 362 of the first inverter 506, and input port 360 of the second inverter 508 all constitute the same electrical node. Also, the input port of the seventh inverter 546, output port of the sixth inverter 544, output port 362 of the fourth inverter 512, and input port 360 of the fifth inverter 514 all constitute the same electrical node.

Due the differences between the third circuit 500 and the second circuit 300, the third circuit provides certain advantages relative to the second circuit, and can be considered an improved core circuit implementation relative to the second circuit. First, it will be appreciated that the fixed delay circuit (or fixed delay cell) 516, which includes the CMOS inverter 340 in combination with the NMOS transistor 342 (which can be a long channel NMOS device), is added outside of the feedback loop formed by the RC networks 320 and 322, operational amplifier 146, and tunable delay circuit 502. By virtue of the fixed delay circuit 516 being outside of the feedback loop, an additional delay is provided outside the feedback loop that reduces the required phase shift inside of the feedback loop. This additional delay improves the phase margin, and allows for a smaller frequency compensation capacitance and resistance to be employed (e.g., as provided by the capacitor 338 and resistor 504).

Additionally, based upon the previous discussion regarding the first and second circuits 100 and 300, it will be appreciated that the third circuit 500 particularly employs the feedback loop in order to cause tuning of the tunable delay circuit 502 to provide an output such that the first and second output signals provided at the first and second output ports 122 and 124 are 90 degrees out of phase with one another. To operate in this manner, the third circuit 500 is configured to provide feedback via the feedback loop (again, via the RC networks 320 and 322, the operational amplifier 136, and the tunable delay circuit 502) so that there is a 90° phase shift between delayed positive differential input signal $V_p$ and the intermediate signal $V_{p,delay}$. The first, second, fourth, and fifth inverters 506, 508, 512, and 514 help to achieve such operation.

More particularly, the first and second inverters 506 and 508 in the first main signal path 530 (involving communication of the positive differential input signal $V_{in,p}$ to the first latch 106) serve to match the third inverter 510 and inverter 336 in the delayed signal path 536. Likewise, the fourth and fifth inverters 512 and 514 in the second main signal path 550 (involving communication of the negative differential input signal $V_{in,n}$ to the second latch 108) also serve to match the third inverter 510 and inverter 336 in the delayed signal path 536. With these matching inverters provided in the first and second main signal paths 530 and 550, the required 90° phase shift between delayed positive differential input signal $V_p$ and the intermediate signal $V_{p,delay}$ is created only by the tunable delay circuit (or cell) 502 and the fixed delay circuit (or cell) 516. This also ensures that the first and second latches 106 and 108 are driven by the same inverter type, thereby improving symmetry. Overall, the fifth circuit 500 embodiment is more capable of effectively avoiding any instability that might otherwise arise due to the negative feedback loop than the third circuit 300. Additionally, the back-to-back inverter provided by the edge aligner circuit 518 in the fifth circuit 500 serves to provide edge alignment and reduces any input phase error. That is, output phase errors that might result from any input phase errors are eliminated (or reduced or minimized) through the use of an edge aligner circuit 518.

Turning now to FIG. 6, a schematic diagram shows a fourth circuit 600. In contrast to the first, second, and third circuits 100, 300, and 500 of FIGS. 1, 3, and 5, the fourth circuit 600 includes a pair of cores (circuits or subcircuits) that together form a four-phase generator. That is, in contrast to the first, second, and third circuits 100, 300, and 500, which show portions (e.g., effectively half-portions) of a four-phase generator, the fourth circuit 600 constitutes a four-phase generator in its entirety by combining two cores. The four-phase generator provided by the fourth circuit 600 particularly operates to generate four output signals that are successively out of phase with one another by 90 degrees. That is, a second output signal is 90 degrees phase-delayed (or phase-advanced) relative to a first output signal, a third output signal is 90 degrees phase-delayed (or phase-advanced) relative to the second output signal (or 180 degrees relative to the first output signal), a fourth output signal is 90 degrees phase-delayed (or phase-advanced) relative to the third output signal (or 270 degrees relative to the first output signal), and correspondingly the fourth output signal is also 90 degrees phase-advanced (or phased-delayed) relative to the first output signal (or at least a subsequent period of the first output signal). Although the fourth circuit 600 is configured to generate four output signals with four different phases (rather than two output signals with two different phases), the fourth circuit 600 still is configured to generate those four output signals based upon two differential input signals (each having 50% duty cycles). Additionally, the fourth circuit 600 provides symmetric loading to its source and the load is also driven symmetrically.

The fourth circuit 600 shares in common many of the same components and component arrangements that are present in one or more of the first, second, and third circuits 100, 300, and 500, respectively. In particular, the fourth circuit 600 includes the third circuit 500 in its entirety, which forms one of the pair of cores of the fourth circuit. Accordingly, it can be seen that the fourth circuit 600 includes the first input port 102, the second input port 104, the first latch 106, the second latch 108, the third linkage 118, the first output port 122, the second output port 124, the fourth linkage 126, the fifth linkage 128, the seventh linkage 132, the operational amplifier 136, the non-inverting input port 142, the inverting input port 144, the output port 146, the eighth linkage 138, the ninth linkage 140, the tenth linkage 148, and the first and second RC networks 320 and 322. Additionally, the fourth circuit 600 also includes each of the tunable delay circuit 502, the first, second, third, fourth, and fifth inverters 506, 508, 510, 512, and 514, respectively, the fixed delay circuit 516, and the edge aligner circuit 518, as well as the eleventh linkage 524, twelfth linkage 526, thirteenth linkage 528, first main signal path 530, fourteenth linkage 532, fifteenth linkage 534, sixteenth linkage 538, seventeenth linkage 540, eighteenth linkage 542, delayed signal path 536, and second main signal path 550. All of these components are coupled with one another, as well as coupled to the supply voltage 328 (or alternative voltage or source node or location), the supply voltage 352 ($V_{dd}$), and the ground voltage 354 ($V_{ss}$) in the same manners as discussed above in regard to FIG. 5.

In addition to the above components, the fourth circuit 600 further includes additional components that form the second of the pair of cores of the fourth circuit, and that additionally couple the two cores of the fourth circuits with one another. In this regard, it can first be seen that the fourth circuit 600 additionally includes a third output port 602 and a fourth output port 604. As already mentioned, the third circuit 500 is configured to output first and second output signals $V_{out,\ 0°}$ and $V_{out,\ 90°}$, respectively, at the first output port 122 and the second output port 124 and, assuming desired operation, the second output signal is 90° phase shifted (e.g., phase delayed) relative to the first output signal. This is also the case when the circuit 500 is implemented as part of the fourth circuit 600. Additionally, so that the fourth circuit 600 operates as a four-phase generator, the fourth circuit additionally is configured to output third and fourth output signals $V_{out,\ 180°}$ and $V_{out,\ 270°}$ respectively, at the third output port 602 and the second output port 604. Assuming desired operation, the third output signal $V_{out,\ 180°}$ is 90° phase shifted (e.g., phase delayed) relative to the second output signal $V_{out,\ 90°}$ (and thus is 180° phase shifted relative to the first output signal), and likewise the fourth output signal $V_{out,\ 270°}$ is 90° phase shifted (e.g., phase delayed) relative to the third output signal $V_{out,\ 180°}$ (and thus is 270° phase shifted relative to the first output signal).

To generate the third and fourth output signals $V_{out,\ 180°}$ and $V_{out,\ 270°}$ the fourth circuit 600 additionally includes a third latch 606 and a fourth latch 608, each of which is a respective SR latch and can take the same form as (can be identical or substantially the same as) each of the first and second latches 106 and 108. Additionally, the fourth circuit 600 also includes a third RC network 610 and a fourth RC network 612, an additional operational amplifier 614, an additional tunable delay circuit 616, an additional fixed delay circuit 618, and an additional inverter 620, which respectively take the same form as (can be identical or substantially the same as) the first RC network 320, the second RC network 322, the operational amplifier 136, the tunable delay circuit 502, the fixed delay circuit 516, and the inverter 510, respectively. As shown, the third output signal $V_{out,\ 180°}$ particularly is generated by the third latch 606, the Q terminal of which is coupled to the third output port 602 by way of a first additional linkage 622. By comparison, the fourth output signal $V_{out,\ 270°}$ particularly is generated by the fourth latch 608, the Q terminal of which is coupled to the fourth output port 604 by way of a second additional linkage 624.

As with the first latch 106 and second latch 108, the third latch 606 and fourth latch 608 respectively generate the third and fourth output signals, respectively, based upon the inputs received at their respective S and R terminals. These inputs are provided either by way of the first main signal path 530 or second main signal path 550 already discussed above, or by an additional delayed signal path 630 described in further detail below. More particularly, it can be seen in FIG. 6 that the S terminal of the third latch 606 is coupled to the eighteenth linkage 542. Consequently, the S terminal of the third latch 606 receives, by way of the second main signal path 550, the delayed negative differential input signal $V_n$, which is also provided to the R terminal of the second latch 108 as discussed above. Further, the R terminal of the fourth latch 608 is coupled to the thirteenth linkage 528 by way of a third additional linkage 626. Consequently, the R terminal of the fourth latch 608 receives, by way of the first main signal path 530, the delayed positive differential input signal $V_p$, which is also provided to the S terminal of the first latch 106 as discussed above. It is particularly due to the providing of these signals to the third and fourth latches 606 and 608 that the two cores of the four-phase generator are coupled with one another.

In addition, each of the R terminal of the third latch 606 and the S terminal of the fourth latch 608 receives an additional intermediate (delayed) signal $V_{n,delay}$ provided by way of the additional delayed signal path 630 as governed by an additional feedback loop. The additional intermediate (delayed) signal $V_{n,delay}$ is particularly provided to the S terminal of the fourth latch 608 by way of a fourth additional linkage 628, and is further provided to the R terminal of the third latch 606 by way of a fifth additional linkage 632 directly coupling that R terminal with the fourth additional linkage. The additional intermediate (delayed) signal $V_{n,delay}$ communicated by the fourth additional linkage 628 is generated in response to the negative differential input signal $V_{in,n}$ received at the second input port 104 in the same (or substantially the same) manner that the intermediate signal $V_{p,delay}$ communicated by the third linkage 118 is generated in response to the positive differential input signal $V_{in,p}$ received at the first input port 102.

To achieve such operation, the third RC network 610, fourth RC network 612, additional operational amplifier 614, additional tunable delay circuit 616, additional fixed delay circuit 618, and additional inverter 620 are implemented in the fourth circuit 600 as follows. As shown, the input port 522 of the additional fixed delay circuit 618 is coupled directly to the second input port 104 by way of a sixth additional linkage 634, and the output port 350 of that additional fixed delay circuit is coupled directly to the input port 360 of the additional inverter 620. Further, the output port 362 of the additional inverter 620 is coupled directly to the input port 348 of the additional tunable delay circuit 616 by way of a seventh additional linkage 636, and the fourth additional linkage 628 is coupled directly to the output port 362 of that additional tunable delay circuit. Additionally, the additional tunable delay circuit, additional inverter 620, and third and fourth RC networks 610 and 612 are coupled with one another so as to provide an additional feedback loop.

Further with respect to the additional feedback loop, the non-inverting terminal of the additional operational amplifier 614 is coupled by way of the third RC network 610 to a ninth additional linkage 640, by which the third RC network is coupled directly to the third output port 602, and the inverting terminal of the additional amplifier is coupled by way of the fourth RC network 612 to a tenth additional linkage 642, by which the fourth RC network is coupled directly to the fourth output port 604. As with the first and second RC networks 320 and 322, the respective resistors 324 of the third and fourth RC networks 610 and 612 are coupled between the respective additional linkages (the ninth and tenth linkages 640 and 642) by which those RC networks are coupled to the respective output ports, and the respective non-inverting and inverting input terminals of the additional operational amplifier 614. Further, the respective capacitors 326 of the third and fourth RC networks 610 and 612 again are coupled between the respective non-inverting and inverting input terminals of the additional operational amplifier 614 and the supply terminal 328 (or alternatively to a ground voltage or to some other voltage or source node or location). Further, all of the additional tunable delay circuit 616, additional fixed delay circuit 618, and additional inverter 620 are coupled to the supply voltage 352 ($V_{dd}$), and the ground voltage 354 ($V_{ss}$) in the same manners as discussed above in regard to the corresponding components of the third circuit 500.

Based upon the input signals provided to the non-inverting and inverting input terminals of the additional operational amplifier 614, feedback signals from the output terminal 146 of the additional operational amplifier 614 are provided to the additional tunable delay circuit 616 (particularly to the gate terminal of the NMOS transistor 342 of the delay control circuit 334 thereof) by way of an eighth additional linkage 638 coupling those two components. The generation of feedback signals by the feedback loop and particularly the additional operational amplifier 614 occurs in the same or substantially the same manner as feedback signals are generated by the feedback loop (and particularly the operational amplifier 136) of the third circuit 500.

Figure 7:
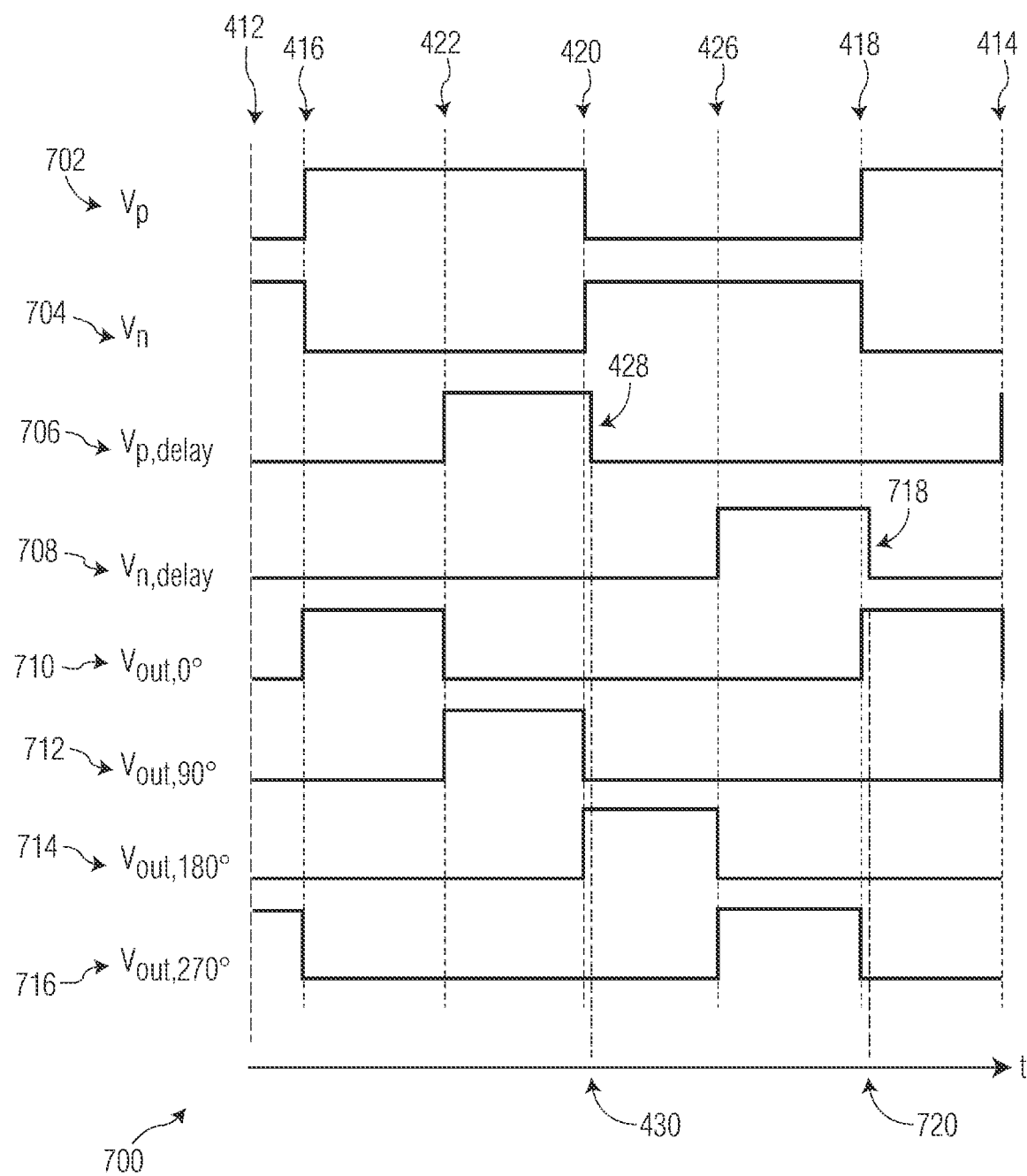
FIG. 7 is a timing diagram illustrating example variations, over a portion of time, of the differential input signals, output signals, and first and second intermediate delayed signals communicated within the four-phase generator circuit of FIG. 6.

Turning to FIG. 7, a further timing diagram 700 illustrates in greater detail example operation of the fourth circuit 600 in terms of generating not only the first and second output signals $V_{out,\,0°}$ and $V_{out,\,90°}$ but also the third and fourth output signals $V_{out,\,180°}$ and $V_{out,\,270°}$, based upon the positive and negative differential input signals $V_{in,p}$ and $V_{in,n}$. Similar to the timing diagram 400 of FIG. 4, the timing diagram 700 particularly includes each of a first graph 702 and a second graph 704 that concern input signals to the fourth circuit 600. Also, insofar as the fourth circuit 600 is a four-phase generator that not only operates based upon the intermediate signal $V_{p,\,delay}$ that is generated by the tunable delay circuit 502 but also the additional intermediate signal V n, delay that is generated by the additional tunable delay circuit 616, the timing diagram includes both a third graph 706 concerning the intermediate signal $V_{p,\,delay}$ and a fourth graph 708 concerning the additional intermediate signal $V_{n,\,delay}$. Further, insofar as the fourth circuit 600 generates not merely the first and second output signals $V_{out,\,0°}$ and $V_{out,\,90°}$ but also the third and fourth output signals $V_{out,\,180°}$ and $V_{out,\,270°}$, the further timing diagram 700 includes each of fifth, sixth, seventh, and eighth graphs 710, 712, 714, and 716, respectively, concerning those first, second, third, and fourth output signals, respectively.

To facilitate comparison between the operation shown by the timing diagram 400 of FIG. 4 and the operation shown by the timing diagram 700 of FIG. 7, the timing diagram 700 shows operation over the same period of time as that which is subject of the timing diagram 400, namely, between the first time 412 and the second time 414. Further, the first and second graphs 702 and 704 are intended to illustrate respectively positive and negative differential input signals that are identical in characteristics (including periodicity) to the input signals respectively shown by the first and second input graphs 402 and 404, respectively. As discussed above, the fourth circuit 600 (and third circuit 500) in contrast to the second circuit 300 (and first circuit 100) includes the first, second, fourth, and fifth inverters 506, 508, 512, and 514, respectively, which respectively introduce delays into the first main signal path 530 and second main signal path 550. Consequently, the most relevant input signals of interest, in terms of illustrating operation of the fourth circuit 600, are the delayed positive and negative differential input signals $V_p$ and $V_n$. Therefore, to facilitate comparison between FIG. 7 and FIG. 4, the first and second graphs 702 and 704 particularly illustrate excerpts of the delayed positive and negative differential input signals $V_p$ and $V_n$ that are identical over time to the excerpts of the positive and negative differential input signals $V_{in,p}$ and $V_{in,n}$ respectively shown by the first and second graphs 402 and 404.

Given these input signals as shown by the first and second graphs 702 and 704, it can be seen from the third, fifth, and sixth graphs 706, 710, and 712, respectively, that the operation of the third circuit 500 portion of the fourth circuit 600 is identical (or substantially identical) to that shown in FIG. 4. Again, as in the third graph 406 of FIG. 4, the third graph 706 shows that intermediate signal $V_{p,\,delay}$ has a rising edge at the sixth time 422 and has the falling edge 428 at the seventh time 430 that occurs shortly after the fifth time 420. Further, it should be appreciated that the fifth and sixth graphs 710 and 712 are identical (or substantially identical) to the fourth and fifth graphs 408 and 410 of FIG. 4, respectively, in terms of the variation of the first and second output signals $V_{out,\,0°}$ and $V_{out,\,90°}$ provided at the first and second output ports 122 and 124, respectively, over time. Again, each of the first and second output signals $V_{out,\,0°}$ and $V_{out,\,90°}$ is shown to have a 25% duty cycle, with the respective output signals having rising edges at the third time 416 and the sixth time 422, respectively, and falling edges at the sixth time and fifth time 420, respectively.

As shown by the first and second graphs 702 and 704, the delayed positive and negative differential input signals $V_p$ and $V_n$ are identical with one another except insofar as the two signals are 180° (or substantially 180°) out of phase with one another, such that the two signals are in (or substantially in) anti-phase relative to one another. Consistent with these characteristics of these input signals, the fourth, seventh, and eighth graphs 708, 714, and 716, respectively concerning the additional intermediate signal $V_{n,\,delay}$, third output signal $V_{out,\,180°}$, and fourth output signal $V_{out,\,270°}$, respectively show signal portions that are 180° (or substantially 180°) out of phase relative to the signal portions shown by the third, fifth, and sixth graphs 706, 710, and 712, respectively. That is, the fourth graph 708 shows that the additional intermediate signal $V_{n,\,delay}$ has a rising edge at the eighth time 426, which is a half period after the sixth time 426 at which the intermediate signal $V_{p,\,delay}$ has a rising edge. Also, the fourth graph 708 shows that the additional intermediate signal $V_{n,\,delay}$ has a falling edge 718 at an additional time 720 that occurs shortly after the fourth time 418, and that is a half period after the seventh time 430 at which the intermediate signal $V_{p,\,delay}$ has the falling edge 428.

Additionally, the seventh and eighth graphs 714 and 716 respectively concerning the third output signal $V_{out,\,180°}$ and fourth output signal $V_{out,\,270°}$, show those respective signals as having rising edges respectively at the fifth time 420 and eighth time 426, each of which is a half period after the rising edges of the first and second output signals $V_{out,\,0°}$ and $V_{out,\,90°}$ at the third time 416 and sixth time 422, respectively. Also, the seventh and eighth graphs 714 and 716 show the third output signal $V_{out,\,180°}$ and fourth output signal $V_{out,\,270°}$ as respectively having falling edges at the eighth time 426 and the fourth time 418, each of which is a half period after the falling edges of the first and second output signals $V_{out,\,0°}$ and $V_{out,\,90°}$ at the sixth time 422 and fifth time 420, respectively.

It should be appreciated that the timing diagram 700 of FIG. 7 (as well as the timing diagrams 200 and 400 of FIGS. 2 and 4) represent idealized or substantially idealized operation of the fourth circuit 600 (or the first circuit 100 or second circuit 300, respectively). It is possible that various sources of error can affect the exactness of the output signals in terms of the relative phases or other characteristics of the output signals. In particular, device mismatch in the operational amplifiers 136 and 614 and the feedback loops more generally (e.g., with respect to the RC networks or filters 320, 322, 610 and 612 and the inverters, such as the inverters of the tunable delay circuits 502 and 616, as well as with respect to the SR latches 106, 108, 606, 608 and any loads) can be the dominant error contributor. Such device mismatches and associated errors can be eliminated (or at least reduced or minimized) with appropriate device sizing and layout symmetry. Also, the loop gain(s) of the feedback loop(s) can be designed in an orthogonal manner and should be set at high enough levels to keep the error contribution(s) small.

A further possible source of phase error(s) in the output signals provided by the fourth circuit 600 is operation of the fourth circuit based upon differential input signals that do not have 50% duty cycles. Indeed, if one or both of the positive and negative differential input signals $V_{in,p}$ and $V_{in,n}$ received by the fourth circuit 600 have non-50% duty cycle(s), this can result in phase error(s) in one or more of the first, second, third, and fourth output signals $V_{out, 0°}$ $V_{out, 90°}$, $V_{out, 180°}$, and $V_{out, 270°}$, respectively. In view of such concerns, although not described above, in some alternate embodiments the fourth circuit 600 can be further modified to perform input duty cycle correction—indeed, depending on the application requirements, a duty cycle correction circuit may be appropriate or needed.

Referring again to FIG. 6 in this regard, in some alternate embodiments, the fourth circuit 600 can take a modified form that includes a duty cycle correction circuit 650, which is represented in FIG. 6 by a dashed box to signify that the duty cycle correction is optional. In such embodiments, the duty cycle correction circuit 650 can have first and second input terminals 652 and 654 that respectively are directly coupled to the first input port 102 and second input port 104. Also, the duty cycle correction circuit can have a first output port 656 that is coupled to each of the eleventh linkage 524 and the fourteenth linkage 532, and also a second output port 658 that is coupled to each of the sixteenth linkage 538 and sixth additional linkage 634 as shown in FIG. 6 and described earlier. With such an arrangement, the duty cycle correction circuit 650 can generate, based upon the positive and negative differential input signals $V_{in,p}$ and $V_{in,n}$, modified positive and negative differential input signals (e.g., $V'_{in,p}$ and $V'_{in,n}$) that are respectively output at the first output port 656 and second output port 658 for use by the remainder of the modified version of the fourth circuit (instead of using the positive and negative differential input signals $V_{in,p}$ and $V_{in,n}$).

The duty cycle correction circuit 650 can take any of a variety of forms depending upon the embodiment. For example, an example duty cycle correction apparatus is shown in U.S. Patent Application Publication No. US 2002/0140477 A1 entitled "Duty cycle correction circuit and apparatus and method employing same" and published on Oct. 3, 2002 (inventor Jian Zhou et al.), which is hereby incorporated by reference herein.

Also, in at least some embodiments, operation of the duty cycle correction circuit requires measurements of duty cycle error in order to perform duty cycle correction. Such duty cycle measurements can be determined from the delayed negative differential input signal $V_2$ and the delayed positive differential input signal $V_p$ as communicated on the eighteenth linkage 542 and third additional linkage 626, for example. Such signal information can be useful and convenient for measuring duty cycle error because those delayed negative and positive differential input signals are the signals that are directly provided to the S (and R) input terminals of the first, second, third, and fourth latches 106, 108, 606, and 608, and can be obtained in a manner that avoids interaction with the two feedback loops. Accordingly, FIG. 6 additionally shows first and second dashed lines 646 and 648 linking the third additional linkage 626 and the eighteenth linkage 542 to the duty cycle correction circuit 650, for provision of signal information to the duty cycle correction circuit regarding the delayed positive and negative differential input signals $V_p$ and $V_n$, respectively. Additionally, although FIG. 6 by way of the dashed lines 646 and 648 illustrates an embodiment in which measurements related to duty cycle error are determined from the delayed positive and negative differential input signals $V_p$ and $V_n$, in alternate embodiments duty cycle error can be determined from other locations. For example, in one alternate embodiment, duty cycle measurements are obtained at the first and third output ports 122 and 602.

Notwithstanding the above description, the present disclosure is intended to encompass numerous embodiments including those disclosed herein as well as a variety of alternate embodiments. For example, although the above description particularly envisions four-phase generators that provide four output signals that are successively out of phase with one another by 90 degree phase shifts, the present disclosure also is intended to encompass other multi-phase generators in which other numbers of output signals are out of phase with one another (e.g., a two-phase generator in which each the two output signals are 90 degrees out of phase with one another). Also, in some alternate embodiments, the output signals that are generated can be out of phase with one another by amounts other than 90 degree intervals or multiples of 90 degree intervals.

Additionally for example, although the above description describes the first, second, third, and fourth circuits 100, 300, 500, and 600 as employing various linkages that allow for direct or indirect connections between among components or coupling of components, the present disclosure is not intended to be limited to embodiments that employ all of such linkages or employ any particular structures as or in place of such linkages. For example, depending upon the embodiment, any two components or component structures described above as being directly coupled by a linkage can be implemented by way of a wire connection (or a trace) connecting those two components/component structures or instead be implemented as a single, unified, or integrated structure. Additionally, although the above description envisions embodiments in which certain components or component structures are directly coupled or constitute the same (or substantially the same) electrical node, the present disclosure is also intended to encompass embodiments in which such components or component structures are indirectly coupled by way of one or more additional circuit components or electrical components.

The present disclosure is intended to encompass embodiments in which four-phase generators or other multi-phase generators are implemented in other systems or utilized for other applications. For example, four-phase (or other multi-phase) generators can be employed in a variety of RF receivers, transmitters, or transceivers. Further for example in this regard, four-phase signals with 25% duty cycle are abundantly used in quadrature RF transceivers in order to modulate and demodulate quadrature signals. Accordingly, the present disclosure is intended to encompass embodiments in which four-phase generators such as those described herein are implemented in such transceivers. Additionally, the present disclosure is intended to encompass embodiments in which four-phase generators are employed in quadrature mixers or filters, or in other applications that employ signals having four phases. Further for example, the present disclosure is intended to encompass the implementation or use of four-phase generators in applications involving N-path filters, where N=4. Such filters are tunable and can have a much higher quality factor compared to conventional RC filters.

Further, in at least some example embodiments encompassed herein, the present disclosure relates to a four-phase generation circuit. The four-phase generation circuit includes first and second input ports configured to receive positive and negative differential input signals, respectively, the negative differential input signal being out of phase by or substantially by 180 degrees relative to the positive differential input signal. The four-phase generation circuit also includes first, second, third, and fourth output ports configured to output first, second, third and fourth output signals, respectively, where the second, third, and fourth output signals are respectively phase-shifted relative to the first output signal by or substantially by 90 degrees, 180 degrees, and 270 degrees, respectively. Additionally, the four-phase generation circuit includes first, second, third, and fourth SR latches each having a respective first input terminal, and respectively including first, second, third, and fourth output terminals that are respectively coupled to the first, second, third, and fourth output ports, respectively. Further, the four-phase generation circuit includes first and second tunable delay circuits coupled at least indirectly between the first and second input ports, respectively, and the respective first input terminals of the second and fourth SR latches, respectively. Additionally, the four-phase generation circuit includes first and second comparison circuits, the first comparison circuit being coupled at least indirectly between the first and second output ports and the first tunable delay circuit and configured to output a first feedback signal, and the second comparison circuit being coupled at least indirectly between the third and fourth output ports and the second tunable delay circuit and configured to output a second feedback signal. The respective first input terminals of the first and third SR latches are respectively coupled at least indirectly to the first and second input ports, respectively, so as to respectively receive first and second input signals that are, or are based upon, the positive and negative differential input signals, respectively. Further, the respective first input terminals of the second and fourth SR latches receive first and second delayed input signals, respectively, which are respectively based upon the positive and negative differential input signals respectively but are delayed relative to the positive and negative differential input signals respectively by the first and second tunable delay circuits operating respectively based upon the first and second feedback signals.

Additionally, in at least one further example embodiment encompassed herein, the present disclosure relates to a method of four-phase generation. The method includes receiving positive and negative differential input signals, respectively, at first and second input ports, respectively, wherein the negative differential input signal is out of phase by or substantially by 180 degrees relative to the positive differential input signal. The method also includes providing first, second, third, and fourth output signals at first, second, third, and fourth output ports, where the first, second, third and fourth output signals are provided from respective output terminals of first, second, third, and fourth SR latches. The first and third output signals are generated by the first and third SR latches based at least in part upon first and second input signals that are received at respective first input terminals of the first and third SR latches, respectively, and that are based at least indirectly upon the positive and negative differential input signals, respectively. The second and fourth output signals are generated by the second and fourth SR latches based at least in part upon first and second delayed signals that are received at respective first input terminals of the second and fourth SR latches, respectively, and that are based at least indirectly upon the positive and negative differential input signals, respectively, but are delayed relative to the positive and negative differential input signals respectively at least in part by first and second delays respectively provided by the first and second tunable delay circuits. Additionally, the method includes generating first and second feedback signals by first and second comparison circuits, respectively, based at least indirectly upon the first and second output signals and at least indirectly upon the third and fourth output signals, respectively. Further, the method includes adjusting one or both of the first and second delays respectively provided by the first and second tunable delay circuits, respectively, based upon the first and second feedback signals respectively, so as to modify one or both of the first and second delayed signals. Due to one or both of the first and second delayed signals being modified, one or more of the first, second, third, and fourth output signals generated by the first, second, third, and fourth SR latches is or are also modified in one or more manners so that the second, third, and fourth output signals tend to be phase-shifted relative to the first output signal by 90 degrees, 180 degrees, and 270 degrees, respectively.

Further, in at least one additional example embodiment encompassed herein, the present disclosure relates to a multi-phase generation circuit. The multi-phase generation circuit has first and second input ports configured to receive first and second differential input signals, respectively, the second differential input signal being out of phase by or substantially by 180 degrees relative to the first differential input signal. Also, the multi-phase generation circuit has first and second output ports configured to output first and second output signals, respectively, where the second output signal is phase-shifted relative to the first output signal by or substantially by 90 degrees. Additionally, the multi-phase generation circuit has first and second SR latches each having a respective first input terminal and a respective second input terminal, and respectively including first and second output terminals that are respectively coupled to the first and second output ports, respectively. The respective first input terminal of the first SR latch is coupled at least indirectly to the first input port so as to receive the first differential input signal or a first related signal based upon the first differential input signal, and the respective second input terminal of the second SR latch is coupled at least indirectly to the second input port so as to receive the second differential input signal or a second related signal based upon the second differential input signal. Further, the multi-phase generation circuit includes a feedback loop portion including a tunable delay circuit coupled at least indirectly between the first input port and each of the respective first input terminal of the second SR latch and the respective second input terminal of the first SR latch, a comparison circuit having an output terminal coupled to a feedback port of the tunable delay circuit, and a filter coupled to each of the first and second output ports and also to non-inverting and inverting input terminals of the comparison circuit. Each of the respective first input terminal of the second SR latch and the respective second input terminal of the first SR latch is coupled at least indirectly to the tunable delay circuit to receive a delayed input signal based upon the first differential input signal, wherein the delayed input signal differs from the first differential input signal at least in that the delayed input signal is delayed by a first phase amount relative to the first differential input signal, the first phase amount being determined by the tunable delay circuit in response to a feedback signal provided to the feedback port from the output terminal of the comparison circuit and based at least indirectly upon the output signals.

One or more of the embodiments encompassed herein can be advantageous in any of a variety of respects. As discussed, the present disclosure in at least some embodiments concerns a new four-phase generator (or quadrature signal generator) that is configured to generate four output signals having four different phases relative to one another (based on four signal paths), where the four-phase generator employs two tunable delay cells and two negative-feedback loops that generate the output phases with 25% duty cycle. Such a four-phase generator does not require a higher input frequency or differential quadrature inputs. Instead, the four output signals having the four different phases are generated from a differential input signal (e.g., a differential input clock signal) having the same frequency as each of the output signals. Each negative-feedback loop continuously measures and minimizes the output phase error (e.g., with respect to at least a respective pair of the output signals). Further, in at least some such embodiments, the required delay (introduced by each respective negative-feedback loop) is split up into a fixed delay and tunable delay, which reduces the phase shift inside the loop. This improves loop stability and allows for a smaller compensation capacitance and resistance. Additionally, at least some embodiments of four-phase (or multi-phase) generators encompassed herein are frequency scalable—that is, the four-phase (or multi-phase) generators can be scaled to other frequencies particularly insofar as the generators employ wideband, high-speed signal path(s) and orthogonal feedback loop(s).

Additionally, at least some embodiments of the four-phase (or multi-phase) generators encompassed herein are advantageous in terms of being robust and accurate in generating output signals with the desired phases and free (or substantially free) from errors. At least some four-phase (or multi-phase) generator circuits encompassed herein are not particularly susceptible to at least some types of errors, and/or can be configured or designed in manners that eliminate (or reduce or minimize) potential sources of error. For example, in at least some embodiments, systematic variations such as process, supply and temperature have minor (if any) impact upon operational performance of the four-phase (or multi-phase) generators thanks to the implementation of the negative-feedback loop(s). Also for example, as already discussed, the four-phase (or multi-phase) generators are configured to avoid false locking conditions. Further, device mismatches and associated errors can be eliminated (or at least reduced or minimized) with appropriate device sizing and layout symmetry. Also, the loop gain(s) of the feedback loop(s) can be designed in an orthogonal manner and can be set at high enough levels to keep the error contribution(s) small.

Further, in at least some embodiments, because the feedback loop(s) do not involve any comparison to any voltage reference (e.g., to one-quarter of the supply voltage) but rather involve direct comparisons between two average output voltages, such four-phase (or multi-phase) generators are generally free from any errors that might arise from comparisons with any voltage reference. Further, in at least some such embodiments, output phase errors that might result from any input phase errors are eliminated (or reduced or minimized) through the use of an edge aligner. Additionally, as discussed above, output signal phase errors that might result from input signal duty cycle errors (e.g., if the input signals have duty cycles of more or less than 50%) can be avoided (or reduced or minimized) by including a duty cycle correction circuit.

While the principles of the invention have been described above in connection with specific apparatus, it is to be clearly understood that this description is made only by way of example and not as a limitation on the scope of the invention. It is specifically intended that the present invention not be limited to the embodiments and illustrations contained herein, but include modified forms of those embodiments including portions of the embodiments and combinations of elements of different embodiments as come within the scope of the following claims.

What is claimed is:

1. A four-phase generation circuit comprising:
    first and second input ports configured to receive positive and negative differential input signals, respectively, the negative differential input signal being out of phase by or substantially by 180 degrees relative to the positive differential input signal;
    first, second, third, and fourth output ports configured to output first, second, third and fourth output signals, respectively, wherein the second, third, and fourth output signals are respectively phase-shifted relative to the first output signal by or substantially by 90 degrees, 180 degrees, and 270 degrees, respectively;
    first, second, third, and fourth SR latches each having a respective first input terminal, and respectively including first, second, third, and fourth output terminals that are respectively coupled to the first, second, third, and fourth output ports, respectively;
    first and second tunable delay circuits coupled at least indirectly between the first and second input ports, respectively, and the respective first input terminals of the second and fourth SR latches, respectively; and
    first and second comparison circuits, the first comparison circuit being coupled at least indirectly between the first and second output ports and the first tunable delay circuit and configured to output a first feedback signal, and the second comparison circuit being coupled at least indirectly between the third and fourth output ports and the second tunable delay circuit and configured to output a second feedback signal,
    wherein the respective first input terminals of the first and third SR latches are respectively coupled at least indirectly to the first and second input ports, respectively, so as to respectively receive first and second input signals that are, or are based upon, the positive and negative differential input signals, respectively, and
    wherein the respective first input terminals of the second and fourth SR latches receive first and second delayed input signals, respectively, which are respectively based upon the positive and negative differential input signals respectively but are delayed relative to the positive and negative differential input signals respectively by the first and second tunable delay circuits operating respectively based upon the first and second feedback signals.

2. The four-phase generation circuit of claim 1, wherein the first comparison circuit is a first operational amplifier, wherein the second comparison circuit is a second operational amplifier, wherein the first operational amplifier outputs the first feedback signal based at least indirectly upon the first and second output signals, and the second operational amplifier outputs the second feedback signal based at least indirectly upon the third and fourth output signals.

3. The four-phase generation circuit of claim 2, further comprising:
a first filter circuit coupling the first operational amplifier at least indirectly with the first and second output ports, and
a second filter circuit coupling the second operational amplifier at least indirectly with the third and fourth output ports,
wherein each of the first and second filter circuits includes a respective low-pass filter circuit, and wherein the respective low-pass filter circuit of each of the first and second filter circuits includes a respective first RC network and a respective second RC network.

4. The four-phase generation circuit of claim 3,
wherein each of the first and second operational amplifiers includes a respective non-inverting input port and a respective inverting input port,
wherein the respective first RC network of the respective low-pass filter circuit of the respective first filter circuit at least indirectly couples the respective non-inverting input port of the first operational amplifier with the first output port,
wherein the respective first RC network of the respective low-pass filter circuit of the respective second filter circuit at least indirectly couples the respective non-inverting input port of the second operational amplifier with the third output port,
wherein the respective second RC network of the respective low-pass filter circuit of the respective first filter circuit at least indirectly couples the respective inverting input port of the first operational amplifier with the second output port, and
wherein the respective second RC network of the respective low-pass filter circuit of the respective second filter circuit at least indirectly couples the respective inverting input port of the second operational amplifier with the fourth output port.

5. The four-phase generation circuit of claim 1,
wherein each of the first and second tunable delay circuits includes a respective delay control circuit and a respective inverter,
wherein the respective delay control circuit of each of the first and second tunable delay circuits includes a respective CMOS inverter coupled in series with a respective NMOS transistor, and
wherein respective gates of the respective NMOS transistors of the respective delay control circuits of the respective first and second tunable delay circuits are configured to receive the first and second feedback signals, respectively.

6. The four-phase generation circuit of claim 5, wherein each of the first and second tunable delay circuits additionally includes one or both of a respective capacitor and a respective resistor that is or are respectively coupled at least indirectly between the respective gate of the respective NMOS transistor of the respective tunable delay circuit and a node.

7. The four-phase generation circuit of claim 5, further comprising first and second fixed delay circuits and first and second additional inverters,
wherein the first fixed delay circuit is coupled between the first input port and the first additional inverter, wherein the first additional inverter is coupled between the first fixed delay circuit and the respective delay control circuit of the first tunable delay circuit, wherein the respective delay control circuit of the first tunable delay circuit is coupled between the first additional inverter and the respective inverter of the first tunable delay circuit, and wherein the respective inverter of the first tunable delay circuit is coupled between the respective delay control circuit of the first tunable delay circuit and the respective first input terminal of the second SR latch, and
wherein the second fixed delay circuit is coupled between the second input port and the second additional inverter, wherein the second additional inverter is coupled between the second fixed delay circuit and the respective delay control circuit of the second tunable delay circuit, wherein the respective delay control circuit of the second tunable delay circuit is coupled between the second additional inverter and the respective inverter of the second tunable delay circuit, and wherein the respective inverter of the second tunable delay circuit is coupled between the respective delay control circuit of the second tunable delay circuit and the respective first input terminal of the fourth SR latch.

8. The four-phase generation circuit of claim 7, further comprising first, second, third, and fourth further inverters,
wherein the respective first input terminal of the first SR latch is coupled to the first input port by way of the first and second further inverters, and the respective first input terminal of the third SR latch is coupled to the second input port by way of the third and fourth further inverters,
wherein the respective inverter of the first tunable delay circuit matches the respective inverter of the second tunable delay circuit, and
wherein each of the first, second, third, and fourth further inverters, each of the respective inverters of the first and second tunable circuits, and each of the first and second additional inverters also matches each of the respective inverters of the first and second tunable delay circuits.

9. The four-phase generation circuit of claim 1,
wherein each of the first, second, third, and fourth SR latches includes a respective second input terminal,
wherein the respective second input terminal of the first SR latch is coupled to the respective first input terminal of the second SR latch,
wherein the respective second input terminal of the second SR latch is coupled to the respective first input terminal of the third SR latch,
wherein the respective second input terminal of the third SR latch is coupled to the respective first input terminal of the fourth SR latch, and
wherein the respective second input terminal of the fourth SR latch is coupled to the respective first input terminal of the first SR latch.

10. The four-phase generation circuit of claim 9, wherein each of the respective first input terminals of the first, second, and fourth SR latches is a respective set terminal, and each of the respective second input terminals of the first, second, and fourth SR latches is a respective reset terminal.

11. The four-phase generation circuit of claim 1, further comprising an edge aligner circuit, wherein the respective first input terminal of the first SR latch is respectively coupled at least indirectly to the first input port by a first intermediate node, wherein the respective first input terminal of the third SR latch is respectively coupled at least indirectly to the second input port by a second intermediate node, and wherein the edge aligner circuit is coupled between the first and second intermediate nodes.

12. The four-phase generation circuit of claim 1, further comprising at least one duty cycle correction circuit, wherein the first input terminals of the first and second latches are coupled to the first and second input ports respectively at least in part by way of the at least one duty cycle correction circuit.

13. The four-phase generation circuit of claim 1, wherein each of the positive and negative differential input signals has a respective input duty cycle equaling or substantially equaling 50%, and each of the first, second, third, and fourth output signals has a respective output duty cycle equaling or substantially equaling 25%.

14. A radio frequency (RF) transceiver system comprising the four-phase generation circuit of claim 1.

15. A method of four-phase generation comprising:
receiving positive and negative differential input signals, respectively, at first and second input ports, respectively, wherein the negative differential input signal is out of phase by or substantially by 180 degrees relative to the positive differential input signal;
providing first, second, third, and fourth output signals at first, second, third, and fourth output ports,
wherein the first, second, third and fourth output signals are provided from respective output terminals of first, second, third, and fourth SR latches, wherein the first and third output signals are generated by the first and third SR latches based at least in part upon first and second input signals that are received at respective first input terminals of the first and third SR latches, respectively, and that are based at least indirectly upon the positive and negative differential input signals, respectively, and
wherein the second and fourth output signals are generated by the second and fourth SR latches based at least in part upon first and second delayed signals that are received at respective first input terminals of the second and fourth SR latches, respectively, and that are based at least indirectly upon the positive and negative differential input signals, respectively, but are delayed relative to the positive and negative differential input signals respectively at least in part by first and second delays respectively provided by first and second tunable delay circuits;
generating first and second feedback signals by first and second comparison circuits, respectively, based at least indirectly upon the first and second output signals and at least indirectly upon the third and fourth output signals, respectively;
adjusting one or both of the first and second delays respectively provided by the first and second tunable delay circuits, respectively, based upon the first and second feedback signals respectively, so as to modify one or both of the first and second delayed signals,
wherein, due to one or both of the first and second delayed signals being modified, one or more of the first, second, third, and fourth output signals generated by the first, second, third, and fourth SR latches is or are also modified in one or more manners so that the second, third, and fourth output signals tend to be phase-shifted relative to the first output signal by 90 degrees, 180 degrees, and 270 degrees, respectively.

16. The method of four-phase generation of claim 15, wherein the first comparison circuit is a first operational amplifier, wherein the second comparison circuit is a second operational amplifier, and further comprising:
low-pass-filtering each of the first, second, third, and fourth output signals by way of first, second, third, and fourth low-pass filters so as to generate first, second, third, and fourth filtered signals;
applying the first and third filtered signals respectively to respective non-inverting input terminals of the first and second operational amplifiers, respectively, and the second and fourth filtered signals respectively to respective inverting input terminals of the first and second operational amplifiers, respectively, wherein the generating of the first and second feedback signals by the first and second operational amplifiers is performed based upon respective comparisons of the first and second filtered signals and of the third and fourth filtered signals, respectively.

17. The method of four-phase generation of claim 15, wherein the adjusting of one or both of the first and second delays causes one or more rising edge times at which one or both of the first and second delayed signals experience rising edges to be modified.

18. The method of four-phase generation of claim 17,
wherein each of the first and second delayed signals is also additionally delayed by respective fixed delay circuits coupled in between the first and second tunable delay circuits and the first and second output ports,
wherein each of the first and second tunable delay circuits includes a respective first inverter,
wherein the respective first input terminals of the first and third SR latches are coupled indirectly to the first and second input ports by way of respective second inverters,
wherein the respective tunable delay circuits are coupled to the respective fixed delay circuits by way of respective third inverters, and
wherein each of the third inverters and second inverters matches each of the first inverters.

19. The method of four-phase generation of claim 17, further comprising performing duty cycle correction in relation to the positive and negative differential input signals, the duty cycle correction being performed based upon the first and second input signals.

20. A multi-phase generation circuit comprising:
first and second input ports configured to receive first and second differential input signals, respectively, the second differential input signal being out of phase by or substantially by 180 degrees relative to the first differential input signal;
first and second output ports configured to output first and second output signals, respectively, wherein the second output signal is phase-shifted relative to the first output signal by or substantially by 90 degrees;
first and second SR latches each having a respective first input terminal and a respective second input terminal, and respectively including first and second output terminals that are respectively coupled to the first and second output ports, respectively, wherein the respective first input terminal of the first SR latch is coupled at least indirectly to the first input port so as to receive the first differential input signal or a first related signal based upon the first differential input signal, and wherein the respective second input terminal of the second SR latch is coupled at least indirectly to the second input port so as to receive the second differential input signal or a second related signal based upon the second differential input signal; and
a feedback loop portion including a tunable delay circuit coupled at least indirectly between the first input port and each of the respective first input terminal of the second SR latch and the respective second input terminal of the first SR latch, a comparison circuit having an output terminal coupled to a feedback port of the tunable delay circuit, and a filter coupled to each of the first and second output ports and also to non-inverting and inverting input terminals of the comparison circuit, wherein each of the respective first input terminal of the second SR latch and the respective second input terminal of the first SR latch is coupled at least indirectly to the tunable delay circuit to receive a delayed input signal based upon the first differential input signal, wherein the delayed input signal differs from the first differential input signal at least in that the delayed input signal is delayed by a first phase amount relative to the first differential input signal, the first phase amount being determined by the tunable delay circuit in response to a feedback signal provided to the feedback port from the output terminal of the comparison circuit and based at least indirectly upon the output signals.

* * * * *